(12) United States Patent
Kunze

(10) Patent No.: US 9,713,265 B2
(45) Date of Patent: Jul. 18, 2017

(54) METHOD, TREATMENT STATION AND ASSEMBLY FOR TREATING A PLANAR MATERIAL TO BE TREATED

(75) Inventor: Henry Kunze, Wendelstein (DE)

(73) Assignee: Atotech Deutschland GmbH, Berlin (DE)

( * ) Notice: Subject to any disclaimer, the term of this patent is extended or adjusted under 35 U.S.C. 154(b) by 117 days.

(21) Appl. No.: 13/320,522

(22) PCT Filed: May 12, 2010

(86) PCT No.: PCT/EP2010/002938
§ 371 (c)(1),
(2), (4) Date: Nov. 14, 2011

(87) PCT Pub. No.: WO2010/130444
PCT Pub. Date: Nov. 18, 2010

(65) Prior Publication Data
US 2012/0080322 A1    Apr. 5, 2012

(30) Foreign Application Priority Data

May 13, 2009    (DE) .................. 10 2009 021 042

(51) Int. Cl.
*C25D 17/00*    (2006.01)
*B05C 3/09*    (2006.01)
(Continued)

(52) U.S. Cl.
CPC ............ *H05K 3/0085* (2013.01); *B05C 3/09* (2013.01); *B05C 11/06* (2013.01); *C25D 7/0621* (2013.01);
(Continued)

(58) Field of Classification Search
CPC .................. B08B 1/02; C25D 7/0621
(Continued)

(56) References Cited

U.S. PATENT DOCUMENTS 3,691,026 A  *  9/1972  Durrwachter et al. .. C25D 5/02
                                                        204/206
3,779,206 A     12/1973  Sato et al.
(Continued)

FOREIGN PATENT DOCUMENTS

CN          1638604 A       7/2005
CN          100466882 C     3/2009
(Continued)

OTHER PUBLICATIONS

Office Action for U.S. Appl. No. 13/320,504 (May 23, 2014).

*Primary Examiner* — Stefanie S Wittenberg
(74) *Attorney, Agent, or Firm* — Mintz Levin Cohn Ferris Glovsky and Popeo, P.C.; Peter F. Corless; Steven M. Jensen

(57) ABSTRACT

In order to remove treatment liquid (21) from a planar material to be treated (10), which is transported in an assembly for the electrolytic or wet-chemical treatment of the material to be treated (10), or to promote the exchange of material on the surface of the material to be treated (10), a roll with a roll surface (4, 14) is provided. The roll surface (4, 14) is arranged relative to a transport path of the material to be treated (10) so that a gap (8, 18) remains between the roll surface (4, 14) and a useful region of the material to be treated (10) opposing the roll surface (4, 14), which extends over the useful region. The roll is driven rotatably so that at the gap (8, 18) a relative speed is produced between the roll surface (4, 14) and the material to be treated (10).

15 Claims, 13 Drawing Sheets

(51) Int. Cl.
  *H05K 3/00* (2006.01)
  *B05C 11/06* (2006.01)
  *C25D 7/06* (2006.01)
  *C25D 21/10* (2006.01)

(52) U.S. Cl.
  CPC .......... *C25D 7/0642* (2013.01); *C25D 17/00* (2013.01); *C25D 21/10* (2013.01); *H05K 2203/0143* (2013.01); *H05K 2203/0746* (2013.01); *H05K 2203/1509* (2013.01); *H05K 2203/1572* (2013.01)

(58) Field of Classification Search
  USPC .................................................. 204/198, 202
  See application file for complete search history.

(56) References Cited

U.S. PATENT DOCUMENTS

| | | | |
|---|---|---|---|
| 4,445,992 A * | 5/1984 | Yamamoto | 204/203 |
| 4,776,939 A | 10/1988 | Blasing et al. | |
| 4,800,001 A | 1/1989 | Ott et al. | |
| 4,859,298 A * | 8/1989 | Senge et al. | 205/705 |
| 5,007,445 A | 4/1991 | Pender | |
| 5,313,685 A | 5/1994 | Kramer et al. | |
| 5,556,532 A | 9/1996 | Markowski | |
| 6,174,418 B1 * | 1/2001 | Ohba | 204/198 |
| 6,440,215 B1 | 8/2002 | Lymn et al. | |
| 7,033,468 B2 | 4/2006 | Hubel | |
| 2005/0103601 A1 | 5/2005 | Hubel | |
| 2008/0116059 A1 * | 5/2008 | Kappler | 204/202 |
| 2008/0142358 A1 | 6/2008 | Schmid | |
| 2010/0126829 A1 | 5/2010 | Nicolet | |

FOREIGN PATENT DOCUMENTS

| | | |
|---|---|---|
| DE | 2202673 A1 | 8/1972 |
| DE | 3603856 A1 | 8/1987 |
| DE | 3624481 A1 | 1/1988 |
| DE | 4337811 A1 | 5/1995 |
| DE | 4337988 A1 | 5/1995 |
| DE | 19519211 A1 | 11/1996 |
| DE | 19522733 A1 | 1/1997 |
| DE | 19539606 A1 | 5/1997 |
| DE | 19717512 A1 | 10/1998 |
| DE | 19802755 A1 | 7/1999 |
| DE | 19939740 A1 | 9/2000 |
| DE | 10019713 A1 | 10/2001 |
| DE | 10206660 C1 | 7/2003 |
| DE | 10358149 B3 | 5/2005 |
| DE | 102005039100 A1 | 2/2007 |
| DE | 102007035086 B3 | 10/2008 |
| DE | 10 2007 038 116 A1 | 2/2009 |
| EP | 0513632 A1 | 11/1992 |
| EP | 0652982 A1 | 5/1995 |
| EP | 0741804 A1 | 11/1996 |
| EP | 0752807 A1 | 1/1997 |
| GB | 2 288 381 | 10/1995 |
| JP | 07-245462 | 9/1995 |
| JP | 08-294678 | 11/1996 |
| JP | 09-326342 | 12/1997 |
| JP | 09-331135 | 12/1997 |
| JP | 2002-096038 | 4/2002 |
| JP | 2005-103601 | 4/2005 |
| JP | 2008-085119 | 4/2008 |
| JP | 2008-137733 | 6/2008 |
| JP | 2009-221580 | 10/2009 |
| WO | 96/38028 | 11/1996 |

* cited by examiner

METHOD, TREATMENT STATION AND ASSEMBLY FOR TREATING A PLANAR MATERIAL TO BE TREATED

CROSS-REFERENCES TO RELATED APPLICATIONS

This application is a 35 U.S.C. §371 U.S. national entry of International Application PCT/EP2010/002938 (WO 2010/130444) having an International filing date of May 12, 2010, which claims under 35 U.S.C. §119 the benefit of German Patent Application No. 10 2009 021 042.3, filed May 13, 2009. The entire contents of both applications are incorporated herein by reference in their entirety.

The invention relates to a method, a treatment station and an assembly for treating a planar material to be treated. In particular, the invention relates to such methods, treatment stations and assemblies which permit a treatment of material to be treated with a sensitive surface or a plurality of sensitive surfaces. The invention also relates to such methods, treatment stations and assemblies in which contact between a useful region of the material to be treated and fixed elements may be reduced.

When processing planar material to be treated, such as for example circuit boards in the circuit board industry, the material to be treated is frequently treated in a wet-chemical process line. In order to remove treatment liquid, such as a process chemical or water, so-called nip rolls may be used. Such rolls may, for example, be used in order to accumulate treatment liquid for immersion treatment in a treatment station, as is disclosed in DE 43 37 988 A1. For improving the exchange of material on the surface of the substrate, nozzles may be used, in order to cause a fluid to flow onto the surface of the material to be treated.

FIG. 18 is a schematic view of a treatment station 200 in which the liquid level of the treatment liquid is higher than a transport plane of the material to be treated 203, so that the material to be treated 203 may be transported immersed. The material to be treated 203 is transported in a horizontal transport direction 204 through the treatment station. For transporting the material to be treated, roll pairs 211-216 are provided which come to bear against the surfaces of the material to be treated 203 facing upwards and/or downwards, in order to transport said material to be treated. In order to avoid the escape of treatment liquid, an inner container 201 is provided in which the treatment liquid is accumulated up to the upper level (not shown). The inner container 201 is enclosed by an outer container 202 so that the outer container 202 collects the treatment liquid overflowing out of the inner container 201. From the treatment liquid 208 collected in the outer container 202, which has a level 209 in the outer container, the treatment liquid is pumped by a pump 210 back into the inner container 201. The treatment liquid may be discharged via flow nozzles 206, 207 or a further treatment member back into the inner container 201.

For accumulating the treatment liquid in the inner container 201 pairs of so-called nip rolls 213, 215 are used in the inflow region and outflow region of the inner container 201. The pairs of nip rolls 213, 215 may, for example, have a cylindrical peripheral surface. If the nip rolls 213a, 213b of the pair 213 and the nip rolls of the roll pair 215 bear against the material to be treated 203, the free cross section through which the treatment liquid may escape from the inner container 201 is restricted. By corresponding adjustment of the delivery rate of the pump 210, a desired level of treatment liquid in the inner container 201 may be set. Additional roll pairs, such as the roll pairs 211, 212, 214 and 216 in the inflow region or outflow region of the treatment station may also act as nip rolls.

If the material to be treated 203 has one or more sensitive surfaces, however, the direct contact between the nip roll pairs 213, 215 and the material to be treated 203, which is over the entire width in conventional nip rolls, i.e. the entire extension transversely to the transport direction 204, of the material to be treated 203, may lead to damage to the surface of the material to be treated 203. Damage to the surfaces of the material to be treated 203 may, for example, be caused by the surface pressure or particles adhering to the surfaces of the nip rolls 213, 215 and surface unevenness. Moreover, in the region of the flow nozzles 206, 207 it may lead to undesirable deflections of the material to be treated 203, for example as a result of the flow conditions in the treatment station. The deflections may bring the material to be treated 203 into contact with other elements of the treatment station.

The object of the invention is to provide a method, a treatment station and an assembly for treating a planar material to be treated in which the risk of damage to sensitive surfaces of the material to be treated may be reduced. The object of the invention is also to provide a method for producing circuit boards, in which the risk of damage to sensitive surface regions of the circuit board may be reduced.

According to the invention, the object is achieved by a method, a treatment station and an assembly for treating a planar material to be treated as set forth in the independent claims. The dependent claims define preferred and advantageous embodiments of the invention.

According to one aspect, a method for treating a planar material to be treated is provided which is transported through an assembly for the electrolytic or wet-chemical treatment of the material to be treated. The material to be treated is subjected in a treatment station of the assembly to a treatment liquid which covers the material to be treated. In the treatment station, a roll with a roll surface is positioned such that the roll surface is spaced apart at least from a useful region of the material to be treated which extends continuously between the edge regions of the material to be treated, so that a gap remains between the roll surface and the useful region of the material to be treated. The roll surface is arranged at least partially in the treatment liquid. The roll is driven rotatably so that at the gap a relative speed is produced between the roll surface and a surface of the material to be treated.

The risk of damage to the surface of the material to be treated may be reduced by the method, as a gap is provided extending between the roll and the useful region of the material to be treated. In one embodiment, the roll may be spaced apart from the entire material to be treated. By the relative speed on the opposing sides of the gap, the exchange of material on a surface of the material to be treated may be promoted and/or an escape of treatment liquid through the gap may be reduced.

The gap remaining between the roll surface and the useful region of the material to be treated may be predetermined by the geometry of the assembly or may result from the balance of forces, in particular, for material to be treated having low inherent rigidity.

The part of the roll surface which is spaced apart from the surface of the material to be treated by the gap height, may move at a speed which differs in orientation and/or value from a transport speed of the material to be treated.

The roll may be driven so that the part of the roll surface defining the gap moves in a direction opposing a transport direction of the material to be treated. As a result, a relative speed may be implemented at the gap, without the roll having to be rotated at a high rotational speed.

The roll is advantageously arranged so that the rotational axis thereof is parallel to a transport plane of the material to be treated.

The roll may be driven so that a value of a circumferential speed of the roll surface is different from a value of the transport speed of the material to be treated and, in particular is greater than the value of transport speed. In this case, the part of the roll surface which is spaced apart from the surface of the material to be treated by the gap height may move in the transport direction of the material to be treated.

The treatment liquid may be removed from the roll by means of a stripping device. The stripping device may be adjusted in order to set a quantity of treatment liquid which is removed from the roll. In this manner, the extent of the exchange of material produced by the roll and/or to what degree the escape of liquid through the gap is reduced may be controlled.

The stripping device may be arranged so that it is at a constant distance from the roll surface. As a result, a uniform effect may be achieved in the axial direction via the roll. The spacing between the stripping device and the roll surface may be adjustable. For example, the stripping device may be configured as a strip which extends parallel to the axis of the roll and may be positioned at different distances from the roll surface.

The roll may be provided as a treatment member in the treatment station. This makes it possible to provide the roll, for example, instead of a flow nozzle. By the use of the roll as a treatment member, a treatment station of small dimensions may be produced. Accordingly, a cost saving may be achieved. Also, the forces acting on the material to be treated may be reduced. Energy costs may be reduced. Also, preservation of the treatment bath may be achieved.

If the roll is used as a treatment member, the minimum gap height between the roll surface and the useful region of the material to be treated may be less than 1 mm, in particular less than 0.7 mm, in particular less than 0.5 mm. The minimum gap height may be at least 0.05 mm, in particular at least 0.07 mm, in particular at least 0.09 mm. The minimum gap height may also be greater than the aforementioned limit values, but should typically be less than 10.0 mm.

The roll may be arranged so that by means of the relative speed between the roll surface and the surface of the material to be treated an exchange of material is increased on a surface of the material to be treated. In particular, the roll may be arranged so that by the rotation of the roll an effect is produced on the treatment liquid on the surface and/or in bores of the material to be treated.

On opposing sides of the roll in the transport direction, the treatment liquid may come into contact with the roll, up to an operating level of the treatment station. The roll may also be arranged completely below the operating level of the treatment station. This permits the use of the roll as a treatment member in one portion of the treatment station which may be spaced apart from the inflow region and the outflow region.

The roll may also be provided in an inflow region or in an outflow region of the treatment station. For example, the roll may be provided in the vicinity of an edge of an inner container of the treatment station. The roll surface forms in this case a retaining surface for holding back the treatment liquid. The escape of treatment liquid through the gap may be reduced by the relative movement at the gap.

If the roll surface serves as a retaining surface, the minimum gap height between the roll surface and the useful region of the material to be treated may be less than 1 mm, in particular less than 0.7 mm, in particular less than 0.5 mm. The minimum gap height may be at least 0.05 mm, in particular at least 0.07 mm, in particular at least 0.09 mm.

A further roll having a further roll surface may be positioned so that a further gap remains between the useful region of the material to be treated and the further roll surface. The roll and the further roll may be arranged on opposing sides of a transport plane of the material to be treated. For example, the roll and the further roll may be arranged so that their axes are arranged at positions which are identical in the transport direction. In further embodiments, the axes of the roll and the further roll may be spaced apart in the transport direction. By the provision of the further roll, the treatment of the material to be treated may be further improved and/or the escape of treatment liquid may be further reduced.

The further roll may be driven rotatably so that the speed of a part of the further roll surface which forms an edge of the further gap, is oriented in the transport direction.

The value of the circumferential speed of the further roll may be equal to the value of the transport speed±20%. As a result, the transport of material to be treated with low inherent rigidity may be advantageously influenced.

The further roll may be driven rotatably so that the roll and the further roll rotate in the same direction.

According to a further aspect, a treatment station for treating a planar material to be treated is provided for an assembly for the electrolytic or wet-chemical treatment of the material to be treated. The treatment station is designed so that during operation a treatment liquid covers the material to be treated. The treatment station comprises a roll with a roll surface which is arranged so that the roll surface is spaced apart from at least a useful region of the material to be treated which extends continuously between the edge regions of the material to be treated, so that a gap remains between the roll surface and the useful region of the material to be treated. The roll is further arranged so that the roll surface is arranged at least partially in the treatment liquid. A drive device is designed to drive the roll rotatably so that at the gap a relative speed is produced between the roll surface and the surface of the material to be treated.

The risk of damage to the surface of the material to be treated may be reduced in the treatment station as a gap is provided extending between the roll and the useful region of the material to be treated. In one embodiment, the roll may be spaced apart from the entire material to be treated. By the relative speed on the opposing edges of the gap, the exchange of material may be promoted on a surface of the material to be treated and/or an escape of treatment liquid through the gap may be reduced.

The drive device may be designed to drive the roll rotatably so that the part of the roll surface defining the gap moves in the direction opposing the transport direction of the material to be treated.

The drive device may be designed to drive the roll rotatably so that an absolute value of a circumferential speed of the roll surface is different from an absolute value of the transport speed of the material to be treated and, in particular, is greater than the absolute value of transport speed.

The roll is advantageously arranged so that its axis of rotation is parallel to a transport plane of the material to be treated.

The treatment station may comprise a stripping device, in particular a stripping device which is adjustable relative to the roll, for removing treatment liquid from the roll.

The roll may be provided as a treatment member in the treatment station. On opposing sides of the roll in the transport direction, the treatment liquid may come into contact with the roll up to an operating level of the treatment station, or the roll may be arranged completely below the operating level of the treatment station.

The roll may be provided in an inflow region or in an outflow region of the treatment station, the roll surface being configured as a retaining surface for holding back the treatment liquid. The roll may, for example, be provided on an edge of an inner region of the treatment station.

The treatment station may comprise a further roll with a further roll surface, which is positioned so that a further gap remains between the useful region of the material to be treated and the further roll surface. The roll and the further roll may be arranged on opposing sides of a transport plane of the material to be treated.

The drive device may be designed to drive the further roll rotatably so that a portion of the further roll surface, which forms an edge of the further gap, rotates in the transport direction. The circumferential speed of the further roll may be equal to the transport speed.

The drive device may be designed to drive the further roll rotatably so that the further roll and the roll rotate in the same direction.

The treatment station may be designed so that it is designed for carrying out the method according to any one of the disclosed embodiments or exemplary embodiments.

The treatment station may further comprise a plurality of transport elements for transporting the material to be treated which, for example, may be configured as transport rolls or transport rollers.

The effects of the embodiments of the treatment station correspond to the effects of the corresponding embodiments of the method.

According to a further aspect, an assembly for treating a planar material to be treated is provided which comprises the treatment station according to an embodiment or an exemplary embodiment.

According to a further aspect, a method for producing a circuit board is provided in which a material to be treated for producing the circuit board by the method is treated according to an embodiment or an exemplary embodiment.

Embodiments of the invention make it possible to remove or hold off a treatment liquid from the material to be treated in an assembly for the electrolytic or wet-chemical treatment of a material to be treated or to promote the exchange of material on the surface of the material to be treated, in an assembly for the electrolytic or wet-chemical treatment of a material to be treated. Thus a roll surface may be arranged spaced apart from a useful region of the material to be treated so that a gap is formed in order to reduce or to avoid direct contact of the useful region with a fixed element.

Embodiments of the invention may be used, in particular, in assemblies in which planar material to be treated with a sensitive surface is transported in a horizontal transport plane or substantially in a horizontal transport plane. However, the embodiments are not restricted to this field of application.

The invention is described in more detail hereinafter with reference to preferred or advantageous embodiments and by referring to the accompanying drawings, in which.

Directional or positional information which refers to the material to be treated is provided relative to the transport direction, according to convention. The direction which, when transporting the material to be treated is parallel and/or non-parallel to the transport direction, is denoted as the longitudinal direction which in the direction in the transport plane at right angles to the transport direction is denoted as the width direction of the material to be treated.

Embodiments of devices and methods are disclosed in which treatment liquid is held off or removed from a material to be treated and/or in which the exchange of material is promoted on the material to be treated. By "treatment liquid" is understood any liquid to which the material to be treated may be subjected in an assembly for electrolytic or wet-chemical treatment, in particular a process chemical, a rinsing liquid such as water or the like.

The embodiments are disclosed in the context of an assembly for the treatment of material to be treated, in which the material to be treated is transported in a horizontal transport plane. Information such as "above the transport plane" or "below the transport plane", "upper surface", "lower surface", as well as references to height or a level of treatment liquid and the like, accordingly refer to the vertical direction, as long as it is not indicated otherwise. By "transport in a horizontal transport plane", may be understood, in particular, a transport of material to be treated in which at least three corners of the material to be treated are located in a horizontal plane. This does not exclude the fact that at least an individual portion or individual regions of the material to be treated during transport are located outside the transport plane, for example in a material to be treated with low inherent rigidity.

Figure 1:
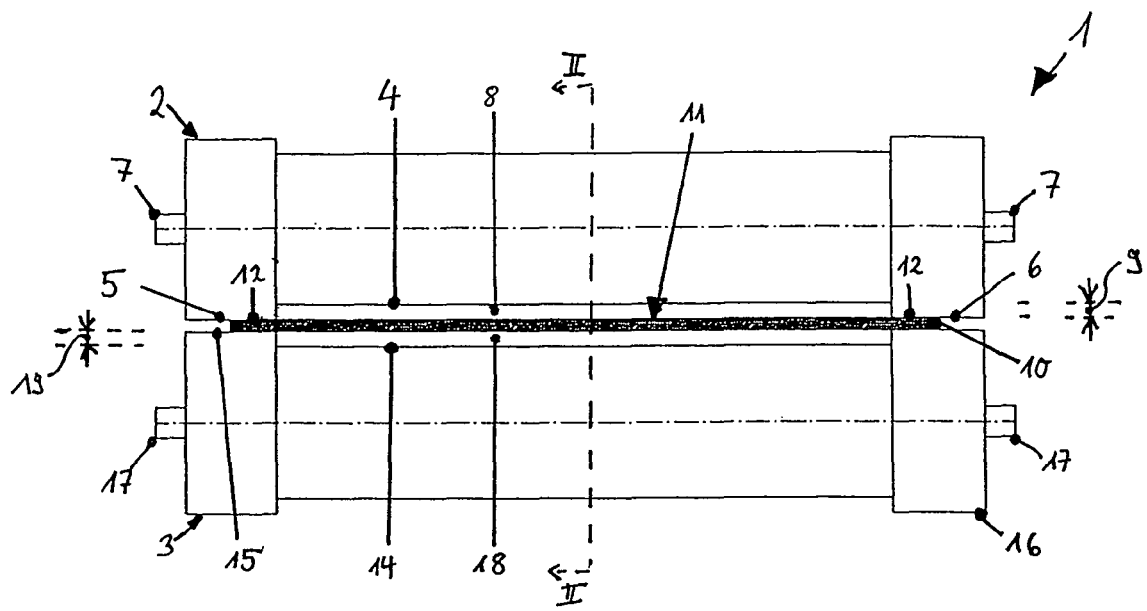
FIG. 1 is a schematic, front view of a device for removing or holding off treatment liquid of a treatment station according to an embodiment.
Figure 2:
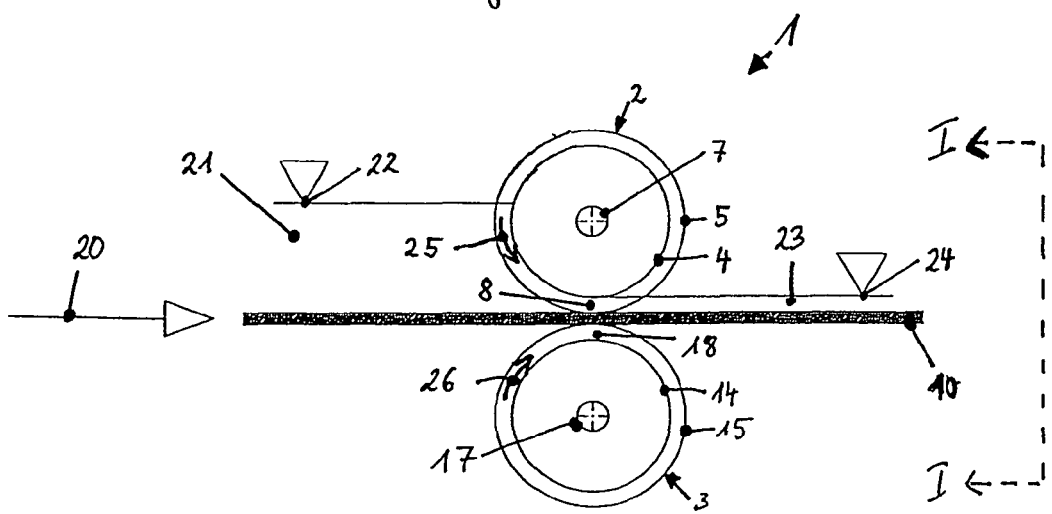
FIG. 2 is a schematic, partially sectional side view of the device of FIG. 1.

FIG. 1 is a schematic front view of a device 1 for removing treatment liquid from a material to be treated 10. FIG. 2 is a schematic side view of the device 1 along the direction denoted in FIG. 1. by II-II. The cutting plane of the partially sectional side view is a vertical plane, which intersects the transport plane along a line on which a useful region of the material to be treated is transported.

Figure 18:
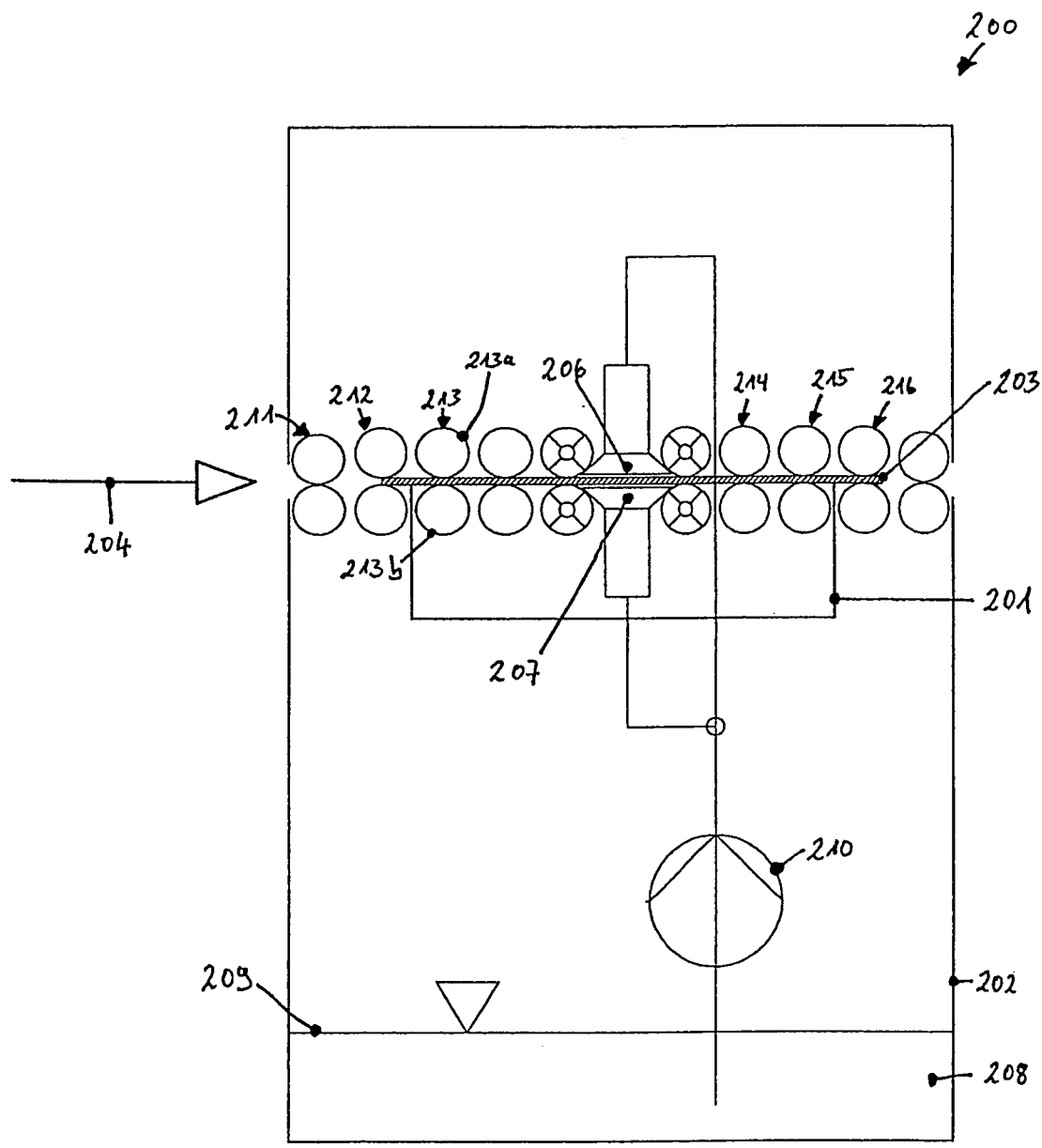
FIG. 18 is a schematic, partially sectional side view of a treatment station with nip roll pairs.

The device 1 comprises a roll 2 and a further roll 3, which are arranged on opposing sides of a transport plane for the material to be treated 10, such that the material to be treated 10 is transported between the roll 2 and the further roll 3. The device 1 may, for example, be used as a pair of nip rolls 213 or 215 in the treatment station 200 of FIG. 18.

The roll 2 has a roll surface 4 configured as a retaining surface for holding back treatment liquid, which is provided as an offset portion of the peripheral surface of the roll 2. The roll 2 is positioned relative to a transport path of the material to be treated 10, so that a gap 8 remains between the retaining surface 4 and the material to be treated 10, when the material to be treated 10 is transported past the roll 2. The portion forming the retaining surface 4 of the peripheral surface of the roll 2 may be configured substantially cylindrically.

The further roll 3 has a further roll surface 14 configured as a retaining surface for holding back treatment liquid which is provided as an offset portion of the peripheral surface of the roll 3. The further roll 3 is positioned relative to the transport path of the material to be treated 10, so that a gap 18 remains between the further retaining surface 14 and the material to be treated 10, when the material to be treated 10 is transported past the roll 3. The portion of the peripheral surface of the roll 3 forming the further retaining surface 14 may be configured substantially cylindrically.

Due to the gaps 8, 18 which are formed by the arrangement and design of the roll 2 and the further roll 3, a useful region 11 of the material to be treated 10 which extends over a large part of the width direction of the material to be treated 10, does not come into contact with fixed elements of the device 1. The risk of damage to the surfaces of the material to be treated 10 in the useful region 11 may be reduced in this manner.

Due to the cylindrical shape of the retaining surface 4 and the further retaining surface 14, the gaps 8, 18 have a gap height and/or clear height which may be altered in the transport direction 20 of the material to be treated 10. A minimum gap height 9, 19 of the gaps 8, 18 is determined by those points of the retaining surfaces 4, 14 which are at the shortest distance from the surface of the material to be treated 10 opposing the respective roll 2 and/or 3.

Even if the gaps 8, 18 permit the passage of treatment liquid, treatment liquid may be removed from the material to be treated 10 by the device 1. In particular, by the tapering of the gaps 8, 18 up to the minimum gap height 9, 19, the device 1 may cause a loss of pressure which may lead to variable liquid levels of the treatment liquid on the two opposing sides of the roll 2 in the transport direction 20.

FIG. 2 shows schematically a treatment liquid 21 which is accumulated on one side of the roll 2 up to a level 22, and a layer of treatment liquid 23 remaining after moving the material to be treated 10 past the device 1, which has a lower level 24. The device 1 may, in particular, be designed so that the treatment liquid 21 is accumulated on one side of the rolls 2, 3 (in FIG. 2 on the left-hand side of the rolls 2, 3) by the retaining surface 4 and the further retaining surface 14 up to a level 22 which, directly on the retaining surface 4, is higher than the minimum gap height 9 of the gap 8 and than the minimum gap height 19 of the gap 18, in each case measured from the lower edge of the corresponding gap 8, 18 at the position with the minimum gap height.

As will be explained in more detail with reference to FIGS. 3-6, 9 and 10, the treatment liquid 23 still remaining on the material to be treated after moving the material to be treated 10 past the retaining surfaces 4, 14 may be removed in a suitable manner, for example by causing fluid to flow onto the material to be treated.

The rolls 2, 3 of the device 1 may not only be designed for removing liquid from the material to be treated 10 but also for transporting the material to be treated 10. To this end, on its two axial ends the roll 2 may have raised edge portions 5, 6 which are brought to bear against an edge region 12 of the material to be treated 10, when the material to be treated is moved past the rolls 2, 3. The raised edge portions 5, 6 may be driven in rotation, in order to transport the material to be treated 10. For the rotational drive of the edge portions 5, 6 a shaft 7 is provided which when using the device 1 is rotatably mounted in a treatment assembly for the material to be treated 10. By rotating the edge portions 5, 6 in a rotational direction 25, the material to be treated 10 may be transported further. Accordingly, the roll 3 on its two axial ends may have raised edge portions 15, 16, which are brought to bear against an edge region 12 of the material to be treated 10, when the material to be treated is moved past the rolls 2, 3. The raised edge portions 15, 16 may be driven in rotation in order to transport the material to be treated 10. For the rotational drive of the edge portions 15, 16 a shaft 17 is provided which, when using the device 1, is rotatably mounted in a treatment assembly for the material to be treated 10. By rotating the edge portions 15, 16 in a rotational direction 26, the material to be treated 10 may be transported further.

The edge portions 5, 6 and/or the edge portions 15, 16 may form a frictional connection and/or a positive connection with the material to be treated 10 in order to transport said material to be treated. For example, on the edge portions 5, 6 and/or on the edge portions 15, 16 projections may be formed which engage in corresponding recesses of the material to be treated 10 in order to transport the material to be treated 10.

In the roll 2, the raised edge portions 5, 6 act as transport portions, which may be coupled to the material to be treated 10 for transporting the material to be treated 10. The retaining surface 4 is offset relative to the edge portions 5, 6. The raising and/or the greater radius of the edge portions 5, 6 in comparison with the radius of the retaining surface 4, determines the minimum gap height 9. Accordingly, in the roll 3 the raised edge portions 15, 16 act as transport portions which may be coupled to the material to be treated 10 for transporting the material to be treated 10. The retaining surface 14 is offset relative to the edge portions 15, 16. The raising and/or the greater radius of the edge portions 15, 16 in comparison with the radius of the retaining surface 14 determines the minimum gap height 19.

The radii of the edge portions and the retaining surface may be selected to be suitable for the desired field of application. For example, the radius of the portion of the roll 2, 3 forming the retaining surface may be less than the radius of the edge portions of the roll 2, 3 which are used as transport portions by less than 1 mm, in particular by less than 0.7 mm, in particular by less than 0.5 mm. The radius of the portion of the roll 2, 3 forming the retaining surface may be less than the radius of the edge portions of the roll 2, 3 which are used as transport portions by at least 0.05 mm, in particular by at least 0.07 mm, in particular by at least 0.09 mm.

Additionally, the shaft 7 of the roll 2 and/or the shaft 17 of the further roll 3 may be mounted with a height-adjustable bearing such that a spacing of the shaft 7 from the upper surface of the material to be treated 10 and/or a spacing of the shaft 17 from the lower surface of the material to be treated 10 may be set.

The roll 2 and the further roll 3 may be designed so that when rotating the edge portions 5, 6 and/or 15, 16 serving as transport portions, the retaining surfaces 4 and/or 14 of the respective roll also rotate in the same direction with the transport portions of the respective roll. To this end, the roll 2 and/or the roll 3, for example, may be designed so that both the transport portions and the retaining surface are configured on the surface thereof fixedly in terms of rotation relative to one another. As the part 4 and/or 14 of the roll surface, which is spaced apart from the useful region 11 of the material to be treated 10 and defines the gap 8 and/or the gap 18, is offset relative to the transport portions 5, 6 or 15, 16, the roll surface of the roll 2, 3 has a circumferential speed which is different from the transport speed of the material to be treated 10. Alternatively, however, the transport portions may be provided to be rotatable relative to the retaining surface, as will be explained in more detail with reference to FIG. 8.

In one embodiment, the transport portions may be provided to be rotatable relative to the retaining surface. An angular speed of the retaining surface may be selected depending on an angular speed of the transport portions, a radius of the transport portions and a radius of the portion of the roll forming the retaining surface.

A plurality of modifications of the device 1 may be implemented in further embodiments.

Whilst, for example, the rolls 2, 3 of the device 1 have at their axial ends raised portions 5, 6, 15, 16, more than two raised portions may also be provided either on the roll 2 or on the further roll 3. The further raised portions may thus, in particular, be arranged on the roll 2 and/or on the further roll 3 so that they come into contact with the material to be treated 10 on surface regions where such a mechanical contact is not critical. For example, surface regions of the material to be treated extending in the longitudinal direction of the material to be treated 10 may be supported by further raised portions of the roll 2 and/or of the further roll 3, if on one of the sides of the material to be treated such contact were not critical. The additional supporting action which is effected by the further raised portions may reduce the risk of undesired contact of the material to be treated 10 in its useful region.

Whilst in the device 1, retaining surfaces 4, 14 which form a gap with a surface of the material to be treated are provided both above and below the transport plane, in a device according to a further embodiment a retaining surface may be provided on one side only, and which forms a gap with a surface of the material to be treated. For example, such a gap-forming retaining surface may be arranged only on the upper side or only on the lower side of the transport plane. On the opposing side, for example, a roll may be provided which has a substantially uniform diameter. The gap-forming retaining surface provided on the other side may lead to a reduction of the forces exerted on the surfaces of the material to be treated, in order to reduce the risk of damage to the surfaces.

In a further embodiment, a peripheral surface of a roll with a diameter which is constant, i.e. which does not vary in the axial direction of the roll, may also serve as a retaining surface which defines a gap between the retaining surface and the surface of the material to be treated. The design of the gap, in particular the minimum gap height, may be made adjustable, by the roll being mounted by a bearing, which is height-adjustable relative to the transport plane. Also, two such rolls may be provided in order to remove liquid on the upper side and on the lower side of the material to be treated, a gap remaining which is formed between the corresponding roll and the material to be treated.

Figure 3:
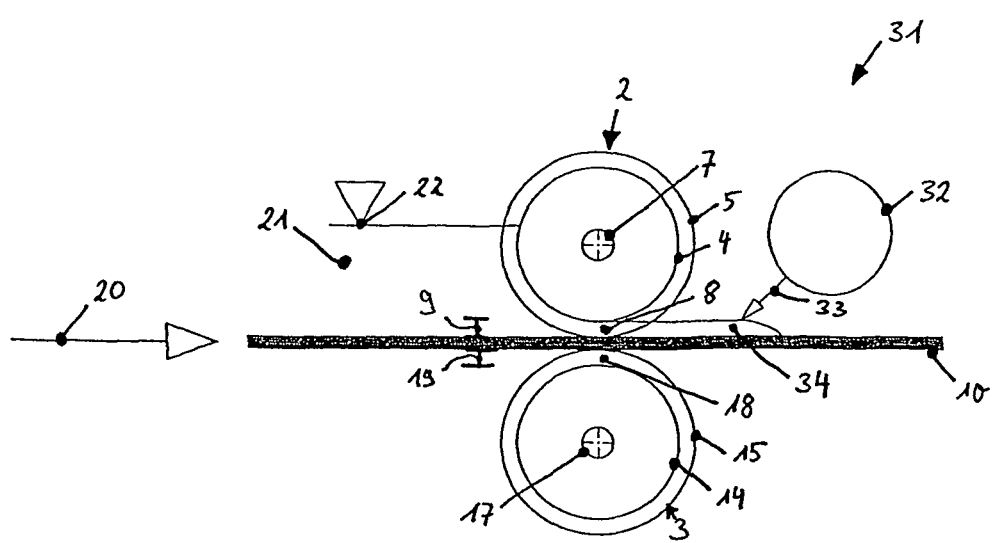
FIG. 3 is a schematic, partially sectional side view of a device for removing treatment liquid of a treatment station according to a further embodiment.

FIG. 3 is a schematic side view of a device 31 for removing treatment liquid according to a further embodiment. The device 31 may be used, for example, in the outflow region of the treatment station 200 of FIG. 18 instead of the pair of nip rolls 214, 215, 216. Elements or equipment of the device 31, which in function and/or design correspond to elements or equipment of the device 1, are provided with the same reference numerals and are not explained again in detail.

The device 31 comprises a roll surface configured as a retaining surface 4 for holding back liquid. The device 31 is designed so that the retaining surface 4 forms a gap 8 with the surface of a material to be treated 10 opposing it (in FIG. 3 with the upper surface of the material to be treated 10). The retaining surface 4 is, for example, provided on the rotatably mounted roll 2. The roll 2 may be designed as described below with reference to FIGS. 1 and 2. In particular, as has been described with reference to FIGS. 1 and 2, the circumferential speed of the roll surface at the gap 8 may be different from the transport speed of the material to be treated 10. The retaining surface 4 removes treatment liquid from the material to be treated 10 transported past the retaining surface 4. As the gap 8 in one embodiment permits the passage of treatment liquid, treatment liquid 34 may still be present on the material to be treated 10 after said material to be treated has passed through the roll 2 with the retaining surface 4.

The device 31 further comprises a flow device 32 with a nozzle arrangement. The flow device 32 in the transport direction is spaced apart from the roll 2 and the retaining surface 4 provided on the roll 2. The flow device 32 is arranged downstream in the transport direction, i.e. in the transport direction after the roll 2 with the retaining surface 4. The flow device 32 is designed to remove from the material to be treated 10 a portion of the treatment liquid 34 which remains on the material to be treated 10 after passing through the gap 8. The flow device 32 may, in particular, be designed to remove from the material to be treated 10 a large portion of the treatment liquid 34 which remains on the material to be treated 10 after passing through the gap 8.

The flow device 32 may discharge a fluid flow 33, in particular a gas flow, for example an air flow, in order to blow away the treatment liquid 34 from the material to be treated 10, or to remove the treatment liquid otherwise by the fluid flow 33. The fluid flow 33 may have at least one flow component in the direction of the gap-forming retaining surface 4 of the device 31 (in FIG. 3 a component oriented to the left). On the retaining surface 4, the treatment liquid may flow to the side of the material to be treated.

The flow device may also be designed so that the fluid flow 33 has a flow component which is oriented parallel to the transport plane and transversely to the transport direction 20, i.e. parallel to the axial direction of the roll 2, on which the retaining surface 4 is formed. In this manner, the treatment liquid 34 may be removed from the material to be treated 10 to the side.

The flow device 32 may extend over the entire width of the material to be treated 10, i.e. over the extension of the material to be treated 10 transversely to the transport direction, over the material to be treated 10. For the discharge of the fluid flow 33, the flow device 32 may comprise one or more nozzle openings. The nozzle openings may, for example, be formed as a continuous slot, a plurality of slots or a plurality of bores, which are formed in the width direction of the material to be treated 10 on the flow device 32. The flow device 32 may be designed so that the spacing of the nozzle openings relative to the surface of the material to be treated 10 is substantially the same size over the entire width of the material to be treated.

The flow device 32 may comprise a straight channel body, which is oriented parallel to the transport plane and transversely to the transport direction 20. The channel body may alternatively be oriented parallel to the transport plane and obliquely to the transport direction 20.

In one embodiment, the shape of the flow device 32 may be such that a central portion of the flow device 32 in the width direction of the material to be treated is arranged closer to the gap-forming retaining surface 4 than an edge portion of the flow device 32. For example, the flow device 32 may have a shape which in a plan view from a direction perpendicular to the transport plane (i.e. in FIG. 3 when viewed perpendicular from above onto the transport plane) has a convex shape towards the gap 8 formed by the retaining surface 4. For example, the flow device 32 in plan view may have a V-shape, the points thereof pointing towards the retaining surface 4. A flow device thus configured is designed to discharge the fluid flow with a speed component in the direction of an edge of the material to be treated, in order to convey effectively the treatment liquid towards the edge of the material to be treated and thus to remove said treatment liquid.

The flow device 32 may be designed to discharge a gas flow, in particular an air flow, which thus flows onto the material to be treated. The flow device 32 may be designed so that an outflow speed of the gas flow 33 is at least 2 m/sec, in particular at least 10 m/sec, in particular at least 30 m/sec.

The flow device 32 may also be designed to discharge a liquid flow and thus to flow onto the material to be treated. The flow device 32 may be designed so that an outflow speed of the liquid flow 33 is at least 0.1 m/sec, in particular at least 1 m/sec, in particular at least 3 m/sec.

The flow device 32 may be designed so that an outflow direction of the fluid flow 33 may be parallel or oblique to the surface of the material to be treated. In particular, the flow device 32 may be configured so that the fluid flow flows out from the nozzle openings of the flow device 32 in the direction of the gap 8 and/or transversely to the transport direction, towards an edge of the material to be treated 10. Alternatively, the outflow direction may also be directed perpendicular to the surface of the material to be treated 10.

The flow device 32 may be configured so that the fluid flow 33 does not pass through the gap 8, i.e. does not enter the treatment liquid accumulated on the opposing side of the gap-forming retaining surface 4. In this manner, it may be avoided or prevented that the fluid flow 33 causes the formation of bubbles in the treatment liquid 21. In order to avoid the passage of the fluid flow 33 through the gap 8, for example a volume flow or one or more of a volume flow, the outflow speed, and/or the outflow direction of the fluid flow 33 from the flow device 32 may be accordingly set.

The device 31 may be designed so that a spacing or the different spacings between the gap 8 and the nozzle opening and/or the nozzle openings of the flow device 32 are at most 100 mm and at least 10 mm.

As shown in FIG. 3, the device 31 may also comprise a further roll surface configured as a retaining surface 14 arranged below the transport plane, which may be formed on a further roll 3.

A plurality of modifications of the device 31 may be implemented in further embodiments. Whilst, for example, with reference to FIG. 3 a device 31 for removing treatment liquid has been described, in which the flow device 32 is arranged downstream of the roll 2 with the gap-forming retaining surface 4 in the transport direction of the material to be treated 10, a device for holding off treatment liquid may also be designed so that the flow device in the transport direction of the material to be treated is arranged in front of and/or upstream of the gap-forming retaining surface. A device thus formed may, in particular, be used in an inflow region of a treatment station.

In a device for removing or holding off treatment liquid according to a further embodiment, the flow device 32 may alternatively or additionally be provided below the transport plane, in order to blow away liquid from an underside of the material to be treated 10 or otherwise to remove liquid from the material to be treated 10 by means of the fluid flow 33 discharged from the flow device.

If the flow device is provided below the transport plane, it may be designed so that the fluid flow produced by the flow device has a speed component parallel to the transport direction which is directed away from the gap-forming retaining surface. For example, in a flow device provided in an outflow region of a treatment station, the fluid flow produced by the flow device may have a speed component oriented in the transport direction.

If a flow device for removing treatment liquid is provided above the transport plane, a transport element may be provided at the corresponding position below the transport plane. In a similar manner, if a flow device for removing treatment liquid is provided below the transport plane, a transport element may be provided at the corresponding position above the transport plane. The transport element and the flow device may be arranged at the same position in the transport direction on opposing sides of the transport plane.

The transport element may, for example, be designed to support and/or transport the material to be treated. The transport element may be configured as a roll. The roll may have an offset retaining surface but may also have a substantially constant diameter in the axial direction. The transport element may also be formed as a wheel axle, on which a plurality of wheels are provided. The wheels may be designed in order to come into contact with the material to be treated for transporting the material to be treated.

Figure 4:
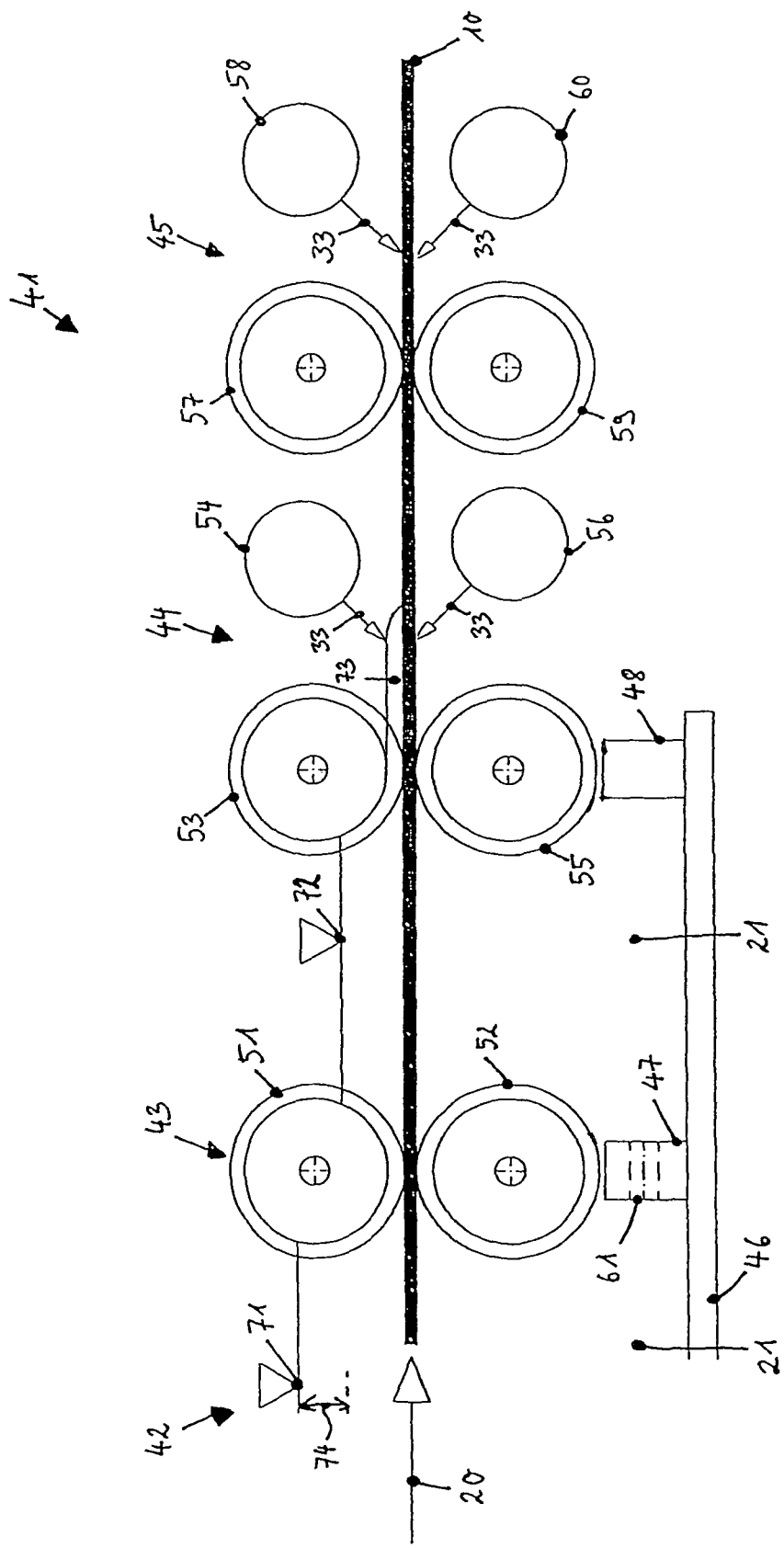
FIG. 4 is a schematic, partially sectional side view of a portion of a treatment station with a plurality of devices for removing treatment liquid according to one embodiment.

FIG. 4 is a schematic side view of an outflow region 41 of a treatment station. Such an outflow region 41 may be provided in the treatment station 200 of FIG. 18 at an end of the inner container 201, at which the material to be treated leaves the treatment station. In the outflow region a material to be treated 10 is transported further in a transport direction 20 from a treatment region 42 in which a treatment liquid 21 covers the material to be treated.

The outflow region 41 comprises a plurality of devices 43, 44 and 45 for removing treatment liquid from the material to be treated 10. The devices 43, 44 and 45 for removing treatment liquid are spaced apart from one another in the transport direction 20, arranged along a transport path of the material to be treated 10. Each of the devices 43, 44 and 45 may have a retaining surface which is arranged relative to the transport plane, so that a gap is formed between the retaining surface and the surface of the material to be treated 10 opposing it.

The devices 43, 44 and 45 may be formed as devices for removing treatment liquid according to one embodiment. In one embodiment, the device 43 may comprise a pair of rolls 51, 52 which are arranged so that the material to be treated 10 may be passed therebetween. On at least one of the rolls 51, 52 of the device 43, a gap-forming retaining surface may be formed for holding back the treatment liquid so that a gap is formed between the retaining surface and the surface of the material to be treated 10 opposing said retaining surface, when the material to be treated is moved past the rolls 51, 52. In particular, at least one of the rolls 51, 52 may have raised edge regions for transporting the material to be treated 10 and an offset retaining surface provided therebetween. The device 43 may, for example, be configured in the manner of the device 1 described with reference to FIGS. 1 and 2. At least the roll 51, 52 on which the gap-forming retaining surface is formed, is driven so that the circumferential speed of the roll surface on the edge of the gap, i.e. along the line on which the roll surface is separated by the minimum gap height from the material to be treated 10, differs in orientation and/or value from the transport speed of the material to be treated 10.

The device 44 may have a roll 53 arranged above the transport plane and a flow device 54 and a roll 55 arranged below the transport plane and a flow device 56. On at least one of the rolls 53, 55 of the device 44, a gap-forming retaining surface may be formed for holding back the treatment liquid so that a gap is formed between the retaining surface and the surface of the material to be treated 10 opposing said retaining surface, when the material to be treated is moved past the rolls 53, 55. In particular, at least one of the rolls 53, 55 may have raised edge regions for transporting the material to be treated 10 and an offset retaining surface provided therebetween, as explained with reference to FIGS. 1 and 2. The flow devices 54 and 56 cause a fluid flow 33 to flow onto the material to be treated 10, for example an air flow, in order to remove treatment liquid remaining on the material to be treated. To this end, the fluid flows 33 discharged by the flow devices 54 and 56 may be directed so that they move and thus remove the treatment liquid in the direction of an edge of the material to be treated.

The device 45 may have a roll 57 arranged above the transport plane and a flow device 58 and a roll 59 arranged below the transport plane and a flow device 60. On at least one of the rolls 57, 59 of the device 45, a gap-forming retaining surface for holding back the treatment liquid may be formed so that a gap is formed between the retaining surface and the surface of the material to be treated 10 opposing said retaining surface, when the material to be treated is moved past the rolls 57, 59. In particular, at least one of the rolls 57, 59 may have raised edge regions for transporting the material to be treated 10 and an offset retaining surface provided therebetween, as explained with reference to FIGS. 1 and 2. The flow devices 58 and 60 cause a fluid flow 33 to flow onto the material to be treated 10, for example an air flow, in order to remove treatment liquid remaining on the material to be treated. To this end, the fluid flows 33 discharged from the flow devices 58 and 60 may be directed so that they move and thus remove the treatment liquid in the direction of an edge of the material to be treated.

Of the rolls 53, 55, 57, 59, at least those which form a gap between the corresponding roll and the material to be treated are rotated so that the circumferential speed of the roll is different at the gap in value and/or orientation from the transport speed of the material to be treated 10.

The gap-forming retaining surfaces of the devices 43, 44 and 45 which the material to be treated 10 passes through in succession, may be of different designs. For example, the gaps on the devices may become increasingly narrow. For example, the device 43 may be designed so that a gap is formed with a first minimum gap height between the retaining surface of the device 43 and the opposing surface of the material to be treated 10, whilst the device 44 arranged downstream of the device 43 in the transport direction may be designed so that a gap is formed with a second minimum gap height between the retaining surface of the device 44 and the opposing surface of the material to be treated 10. Thus, the second minimum gap height on the device 44 may be less than the first minimum gap height on the device 43, i.e. the gaps in the outflow region of the treatment station from one device to a further device for removing treatment liquid arranged downstream in the transport direction may have a lower height.

The device 43, which defines the treatment region 42, is designed so that a difference in levels 74 of the treatment liquid is set between the sides of the roll 51 which oppose one another in the transport direction. In the treatment region 42, the treatment liquid 21 is accumulated up to a level 71, whilst in the adjacent region on the other side of the roll 51, the treatment liquid is accumulated up to a level 72.

The device 44, which is arranged downstream of the device 43 in the transport direction, is designed so that the treatment liquid is removed from the material to be treated 10, when the material to be treated 10 passes through the rolls 53, 55. Treatment liquid 73 which is still present on the material to be treated 10 after moving the material to be treated past the rolls 53, 55, is at least partially removed by the flow devices 54, 56. By the device 45 which is arranged downstream of the device 44 in the transport direction, a further portion of the treatment liquid may be removed from the material to be treated, which after passing through the device 44 may still be present on the material to be treated 10.

By the use of a plurality of devices for removing treatment liquid, treatment liquid may be reliably removed from the material to be treated 10, even when gaps remain between the retaining surfaces and the material to be treated 10.

Between a base 46 of an inner container of the treatment station and the roll 52 of the device 43 arranged below the transport plane, a barrier 47 is provided. By means of the barrier 47, a difference in levels 74 between the liquid levels 71, 72 may be set on both sides of the device 43. To this end, openings 61, for example in the form of elongate holes, bores or slots are formed in the barrier 47. The openings 61 may be able to be closed, in order to adjust the flow of liquid through the barrier 47, and thus adjust the difference in levels 74 between the liquid levels 71 and 72.

The level 72 in the region adjacent to the treatment region 42 is determined by balancing the flows of treatment liquid flowing in and out. In order to be able to adjust said flows and thus the level 72, between the barriers 47, 48 one or more openings, for example closable bores, may be provided in the base 46. By a suitable choice of the openings which are open in the barrier 47, and the openings which are open in the base 46, a basic setting for a desired level 72 in the region adjacent to the treatment region 42 may be selected. Additionally, overflow barriers may be provided on elements which laterally define the treatment station, for example on bearing receivers which are provided for bearing the rolls 51, 52, 53 and 55. Quantities of liquid additionally flowing-in may be discharged via the overflow barriers.

In order to balance the flow of treatment liquid flowing out of the treatment region 42, treatment liquid may be conveyed by a pump (not shown) into the treatment region 42.

Between the base 46 of the inner container of the treatment station and the roll 55 of the device 44 arranged below the transport plane, a barrier 48 is provided. The barrier 48 does not have to have any closeable openings for adjusting the liquid level. The barrier 48 assists with reducing the flow of treatment liquid away from the treatment region.

In further embodiments, modifications to the outflow region 41 may be implemented. In one embodiment, for example, the device 45 may be omitted. Accordingly, two devices for removing treatment liquid may be provided in the outflow region. At least the last of these devices in the transport direction may have a flow device. The flow device may be provided at least above the transport plane.

In a further embodiment, a plurality of devices for removing liquid may be provided which have a barrier with an opening or a plurality of openings for setting a difference in levels. The barrier may in each case have a design as has been explained with reference to the barrier 47. In one embodiment, for example in the inflow or outflow region, two devices may be provided with in each case at least one roll which has a retaining surface for holding back liquid, which forms a gap with the material to be treated guided past said retaining surface, in each of the devices below the transport plane a barrier being provided with an opening or a plurality of openings, as has been described for the barrier 47. In the transport direction spaced apart from both these devices, a further device may be provided which has a design corresponding to the device 44. In this manner, for example, in an inflow and outflow region at least two regions may be formed with a level of treatment liquid which is lower relative to the treatment region.

Whilst in the devices 43-45 for removing liquid in each case a roll is provided both above and below the transport plane, which forms a gap with the material to be treated guided past said roll, in a further embodiment each of the devices for removing liquid may be configured such that a retaining surface is provided only on the roll provided above the transport plane, which leaves a gap between the retaining surface and the material to be treated guided past said roll. The rolls provided below the transport plane may have a uniform diameter in the axial direction of the rolls.

In one embodiment, one of the flow devices 54, 56 may be replaced by a transport element. The transport element may be designed in order to support and/or transport material to be treated. The transport element may, for example, be configured as a roll or wheel axle. Alternatively or additionally, one of the flow devices 58, 60 may be replaced by a transport element. The transport element may be designed in order to support and/or to transport the material to be treated. The transport element may, for example, be configured as a roll or as a wheel axle.

In one embodiment, one of the flow devices 56, 60 provided below the transport plane may be configured so that the fluid flow 33 produced by the flow device 56, 60 has a speed component which faces in the outflow region 41 in the transport direction.

Figure 5:
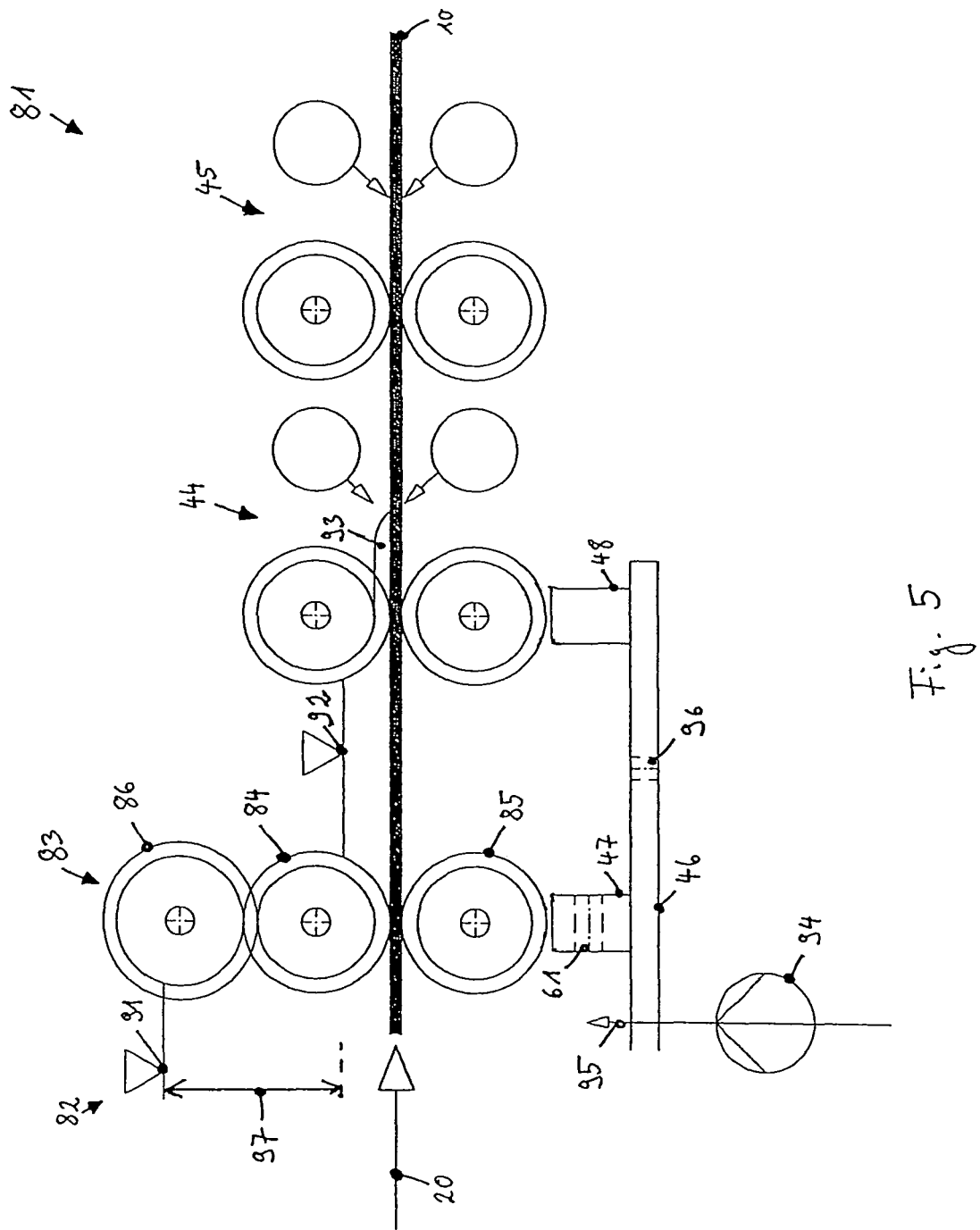
FIG. 5 is a schematic, partially sectional side view of a portion of a treatment station with a plurality of devices for removing treatment liquid according to a further embodiment.

FIG. 5 is a schematic side view of an outflow region 81 of a treatment station. Such an outflow region 81 may be provided in the treatment station 200 of FIG. 18 at an end of the inner container 201 at which the material to be treated leaves the inner container 201. In the outflow region a material to be treated 10 is transported further in a transport direction 20 from a treatment region 82, in which a treatment liquid 21 covers the material to be treated. Elements or devices of the outflow region 81 which in their function and/or design correspond to elements or devices of the outflow region 41, are provided with the same reference numerals and are not explained in detail again.

In specific treatment stations it may be desirable in the treatment region 82 to set a relatively high liquid level 91. The liquid level 91 in the treatment region 82 may, for example, be arranged at least 15 mm above the transport plane.

The outflow region 81 is provided with a plurality of devices 83, 44 and 45 for removing or holding off treatment liquid. The device 83 comprises rolls 84, 85 which are arranged so that the material to be treated 10 may be passed therebetween. On at least one of the rolls 84, 85 of the device 83, a gap-forming retaining surface may be formed for holding back the treatment liquid so that a gap is formed between the retaining surface and the surface of the material to be treated 10 opposing said retaining surface, when the material to be treated is moved past the rolls 84, 85. In particular, at least one of the rolls 84, 85 may have raised edge regions for transporting the material to be treated 10 and an offset retaining surface provided therebetween. The pair of rolls 84, 85 may, for example, be configured as in the device 1 explained with reference to FIGS. 1 and 2. At least the roll 84, 85, on which the gap-forming retaining surface is formed, is driven so that the circumferential speed of the roll surface at the gap, i.e. along the line on which the roll surface is separated by the minimum gap height from the material to be treated 10, differs from the transport speed of the material to be treated 10 in orientation and/or value.

In order to permit an accumulation of treatment liquid up to a high level 91, the device 83 has a further retaining element 86 above the roll 84. The further retaining element 86 is designed to contribute, with a high liquid level in the treatment region 82, to the accumulation of the treatment liquid, by it acting as a wall for the accumulated liquid. The further retaining element 86 may, for example, be configured as a roll which is configured in a complementary manner to the roll 84, so that the rolls 84, 86 are tightly closed and only permit a small passage of liquid or do not permit any passage of liquid between the rolls 84, 86. Other embodiments of the further element 86 are possible, for example in the form of an upstand.

The device 83 is designed so that a difference in levels 97 of the treatment liquid between the level 91 in the treatment region 82 and a level 92 in the region adjacent thereto on the other side of the device 83 is set and maintained via the device 83. The device 44 arranged downstream of the device 83 in the transport direction, removes further treatment liquid from the material to be treated 10 when this material to be treated passes through the device 44. Instead of the level 92, only a smaller amount of treatment liquid 93 is found on the material to be treated 10, when the material to be treated 10 has passed through the roll pair of the device 44. The device 45 arranged downstream of the device 44 in the transport direction may remove even more treatment liquid from the material to be treated 10 provided this is still required after passing through the device 44.

In order to set the difference in levels 97, closeable openings 61 are provided in the barrier 47. The level 92 in the region adjacent to the treatment region 82 is determined by balancing the flows of treatment liquid flowing in and out. In order to be able to set these flows and thus the level 92, one or more openings 96, for example closeable bores, may be provided in the base 46 between the barriers 47, 48. By a suitable choice of openings 61 which are open in the barrier 47, and the openings 96 which are open in the base 46, a basic setting for a desired level 92 in the region adjacent to the treatment region 82 may be selected. Additionally, overflow barriers may be provided on elements which laterally define the treatment station, for example on bearing receivers, which are provided for bearing the rolls of the devices 83 and 44. Quantities of liquid additionally flowing-in may be discharged via the overflow barriers.

In order to balance the flow of treatment liquid flowing out of the treatment region 82, a flow 95 of treatment liquid is conveyed by a pump 94 into the treatment region 82.

Whilst with reference to FIGS. 4 and 5 embodiments of outflow regions of a treatment station have been described, devices for removing or holding off treatment liquid may accordingly also be provided in an inflow region of a treatment station. In particular, in the inflow region a plurality of devices may also be provided spaced apart from one another in the transport direction for removing or holding off treatment liquid, in order to prevent the treatment liquid from flowing onto the material to be treated, before said material to be treated is fed in the inflow region into the treatment station.

The design of the gap-forming retaining surface may be selected in an appropriate manner depending on the specific fields of application.

Figure 6:
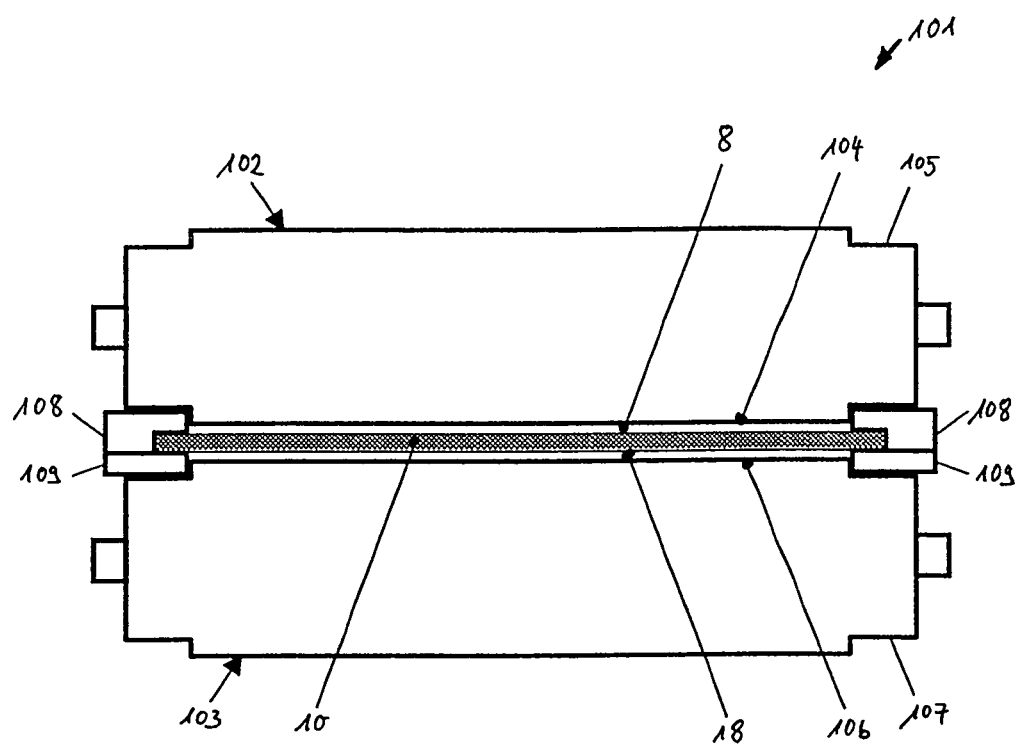
FIG. 6 is a schematic, front view of a device for removing or holding off treatment liquid of a treatment station according to a further embodiment.

FIG. 6 is a schematic front view of a device 101 for removing or holding off treatment liquid according to a further embodiment.

The device 101 comprises a roll 102 and a further roll 103. The roll 102 and the further roll 103 are arranged so that a material to be treated 10 may be transported between the rolls 102 and 103. A peripheral surface of the roll 102 has a retaining surface 104 which is configured for holding back the treatment liquid. The roll 102 with the retaining surface 104 is configured so that a gap 8 remains between the retaining surface 104 of the roll 102 and a surface of the material to be treated 10 opposing said retaining surface, when the material to be treated 10 is moved past the roll 102. Axial end portions 105 of the roll 102 are configured with a smaller diameter than the central portion of the roll 102 defining the retaining surface 104, in order to act as transport portions for transporting the material to be treated 10 if said material to be treated is held on its longitudinal edges by retaining rails.

A peripheral surface of the further roll 103 has a further retaining surface 106 which is configured for holding back the treatment liquid. The further roll 103 with the further retaining surface 106 is designed so that a gap 18 remains between the further retaining surface 106 of the further roll 103, and a surface of the material to be treated 10 opposing this roll, when the material to be treated 10 is moved past the further roll 103. Axial end portions 107 of the further roll 103 are configured with a smaller diameter than the central portion of the further roll 103 defining the further retaining surface 106, in order to act as transport portions for transporting the material to be treated 10, if said material to be treated is held on its longitudinal edges by retaining rails.

On the longitudinal edges of the material to be treated 10, retaining rails 108, 109 are provided which hold the material to be treated for transporting the material to be treated 10. Such retaining rails 108, 109 may, in particular, be used for transporting material to be treated with low inherent rigidity, in order to lend additional stability to the material to be treated. The roll 102 and further roll 103 of the device 101 are designed so that their axial end portions 105, 107 with a smaller diameter come to bear against the retaining rails 108, 109. By rotating the roll 102 and the further roll 103, the material to be treated 10 may be transported further via the retaining rails 108, 109.

In the device 101, the retaining surfaces 104, 106 of the rolls 102, 103 are offset relative to the transport portion provided on the axial end of the rolls 102, 103, so that gaps 8, 18 are formed with the desired minimum gap height between the retaining surfaces 104, 106 and the surfaces of the material to be treated 10 opposing said retaining surfaces, when the material to be treated 10 is moved past the retaining surfaces 104, 106.

In the device 101, the rolls 102, 103 do not directly come into contact with the material to be treated 10. The transport of the material to be treated 10 takes place via a coupling of the transport portions 105, 107 with the retaining rails 108, 109 on which the material to be treated 10 is held.

In the device 101 the roll surface of the roll 102 defining the gap 8 on one side, which forms the retaining surface 104, has a circumferential speed which is lower than the transport speed of the material to be treated 10. The roll surface of the roll 103 defining the gap 18 on one side, which the retaining surface 106 forms, has a circumferential speed which is lower than the transport speed of the material to be treated 10.

In a modification of the device 101, the rolls 102, 103 may be configured so that they come into contact with the material to be treated 10 in an edge region adjacent to the retaining rails 108, 109, in order to transport said material to be treated. To this end, on the rolls 102, 103 raised transport portions may be provided which come into contact with the material to be treated adjacent to the retaining rails 108, 109. The rolls 102, 103 may further be designed so that between the rolls 102, 103 and the retaining rails 108, 109 a gap for displacing liquid is also formed. To this end, correspondingly set-back recesses or grooves relative to the transport portions of the rolls for squeezing liquid from the retaining rails may be provided on the rolls 102, 103. The gap formed between the rolls and the retaining rails may have a minimum gap height which may be less than 1 mm, in particular less than 0.7 mm, in particular less than 0.5 mm. The gap formed between the rolls and the retaining rails may have a minimum gap height which may be at least 0.05 mm, in particular at least 0.07 mm, in particular at least 0.09 mm.

The device 101 for squeezing liquid from the retained material to be treated may also comprise a flow device. The flow device may be configured as explained with reference to FIG. 3. The flow device may be designed, in particular, so that the fluid flow discharged from the flow device also removes treatment liquid from the retaining rails.

In the retaining rails 108, 109, through-holes may be provided which permit the passage of liquid through the retaining rails transversely to the transport direction.

The rolls 102, 103 may be designed in order to exert a force on retaining rails 108, 109 provided on at least one of the longitudinal edges, with a force component which is in the transport plane and is oriented transversely to the transport direction. The force may be oriented so that the retaining rails 108, 109 provided on the opposing longitudinal edges may be forced apart in order to clamp the material to be treated 10 transversely to the transport direction. To this end, for example, the retaining rail(s) 108 and/or 109 on at least one longitudinal edge of the material to be treated may have one or more magnets, in particular permanent magnets. The roll 102 provided above the transport plane and/or the roll 103 provided below the transport plane may have a magnet or a plurality of magnets, in order to exert electromagnetic force on the retaining rail. The force may be oriented so that the retaining rails are forced apart in a resilient manner on the opposing longitudinal edges of the material to be treated 10.

Figure 7:
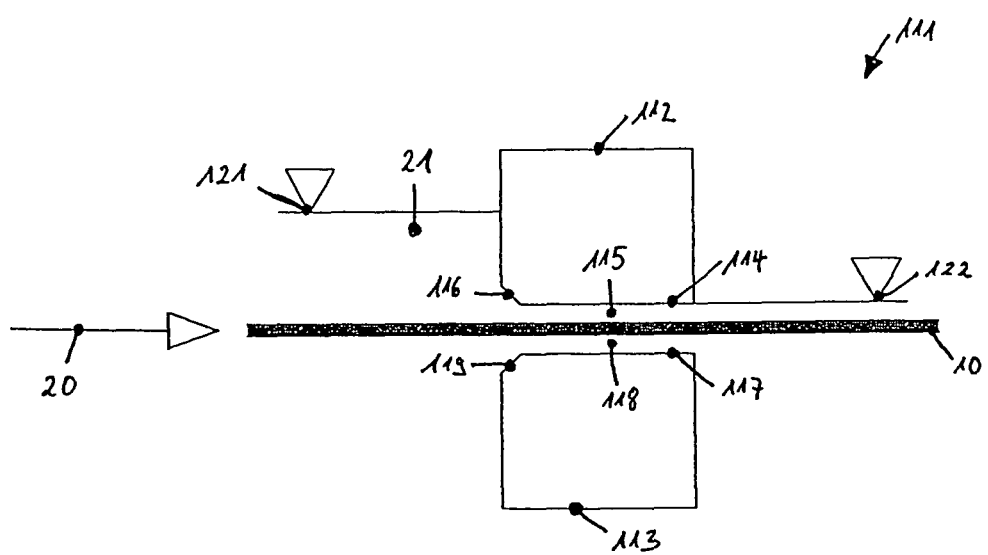
FIG. 7 is a schematic, partially sectional side view of a device for removing treatment liquid.

FIG. 7 is a schematic side view of a device 111 for removing or holding off treatment liquid. In the device 111 the retaining surfaces are not provided on a rotatably mounted roll. According to one embodiment, the device 111 may be provided in a treatment station in combination with a roll with the design disclosed with reference to FIGS. 1-6.

The device 111 comprises two substantially cuboidal elements 112, 113 which may be used as inserts in an assembly for treating a material to be treated 10. The insert 112 is arranged above the transport plane, and the insert 113 is arranged below the transport plane. A surface of the inserts 112, 113 serves as a retaining surface which holds back treatment liquid.

The inserts 112, 113 of the device 111 are arranged relative to a transport path of the material to be treated 10, so that between an upper surface of the material to be treated 10 and a side surface 114 of the insert 112 facing said upper surface, a gap 115 remains if the material to be treated 10 is guided past the device 111, and in that a gap 118 remains between the lower surface of the material to be treated 10 and a side surface 117 of the insert 113 facing said lower surface, when the material to be treated 10 is guided past the device 111. The side surface 114 of the insert 112 and the side surface 117 of the insert 117 may have a planar design, so that the gaps 115 and 118 extend in the transport direction with a uniform gap height.

The inserts 112, 113 of the device 111 have an inflow region opening counter to the transport direction 20, which is formed by chamfers 116, 119 on the inserts 112, 113. Such an inflow region may, for example, be used for guiding material to be treated with low inherent rigidity, for example films.

The device 111 comprising the inserts 112, 113 may be used for accumulating the treatment liquid 21 in an assembly for the electrolytic or wet-chemical treatment of the material to be treated 10. If the material to be treated 10 is guided past the inserts 112, 113 from a treatment region arranged on a first side (left in FIG. 7) of the inserts, in which the treatment liquid 21 is accumulated up to a level 121, a layer of treatment liquid of a smaller depth 122 remains on the material to be treated 10.

The inserts 112, 113 may be configured in a suitable manner according to the structural conditions of the assembly in which the device 111 is used. For example, the inserts 112, 113 may be designed so that the gaps 115, 118 in the transport direction 20 are as long as possible.

The inserts 112, 113 may be mounted fixedly in terms of rotation in the assembly for the electrolytic or wet-chemical treatment. The inserts 112, 113 in the assembly, in particular, may also be attached at a position which is fixed in the transport direction. The inserts 112, 113 may be attached so that they are movable vertically relative to one another.

In a modification of the device 111, a cuboidal insert is provided above the transport plane whilst below the transport plane a roll is provided for transporting the material to be treated. The cuboidal insert may, for example, have the same design as the insert 112 of the device 111.

Figure 8:
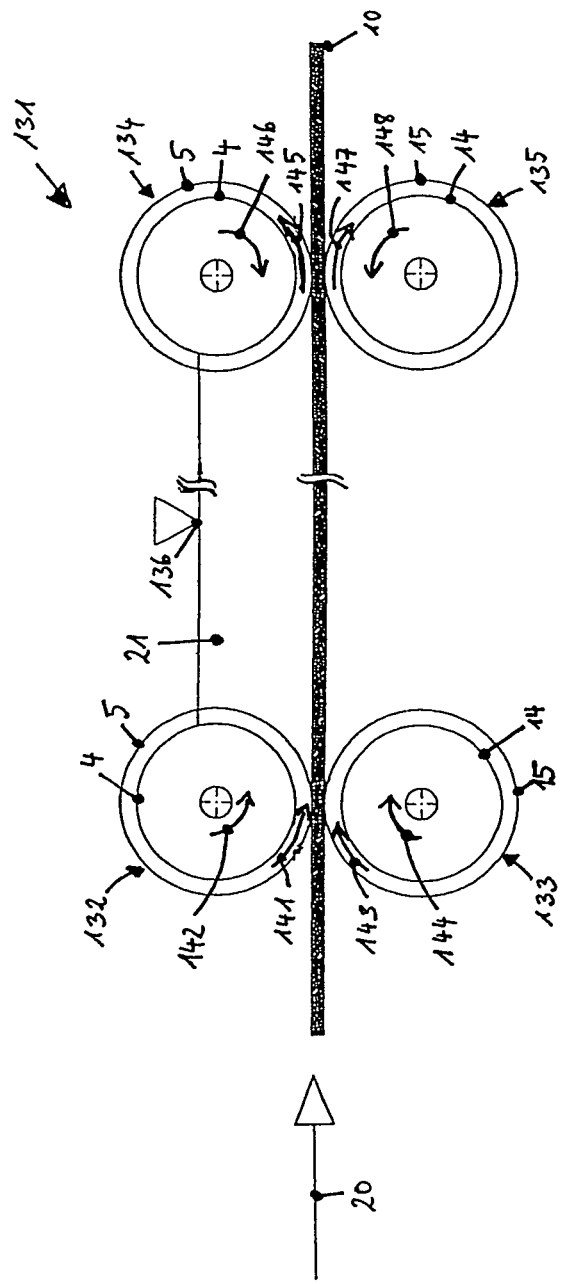
FIG. 8 is a schematic, partially sectional side view of a treatment station with devices for removing or holding off treatment liquid according to an embodiment in an inflow and outflow region.

FIG. 8 is a schematic side view of a treatment station 131 in which in an inflow region a pair of rolls 132, 133 is provided and in an outflow region a further pair of rolls 134, 135 is provided. The roll 132 in the inflow region is arranged above the transport plane and the roll 133 in the inflow region is arranged below the transport plane of a material to be treated 10. The roll 134 in the outflow region is arranged above the transport plane and the roll 135 in the outflow region is arranged below the transport plane of a material to be treated 10. By means of the roll pairs, the treatment liquid 21 in the treatment station 131 is accumulated up to a level 136.

Each of the rolls 132-135 has at its axial ends transport portions in the form of raised portions 5, 15, for transporting the material to be treated. Between the transport portions provided on the ends, a retaining surface 4, 14 with a smaller diameter is formed. As explained with reference to FIGS. 1 and 2, the surface of the rolls formed as a retaining surface 4, 14 forms a gap with the material to be treated guided past the rolls, which extends in the width direction of the material to be treated.

The different portions of the roll 132 in the inflow region are driven rotatably so that the transport portions 5 and the retaining surface 4 arranged therebetween of the roll 132 provided above the transport plane rotate in the same direction. The different portions of the roll 133 in the inflow region are driven rotatably so that the transport portions 15 and the retaining surface 14 arranged therebetween of the roll 133 provided below the transport plane, rotate in the same direction. The rotational direction 141 of the transport portions 5 of the roll 132 provided above the transport plane, is selected so that the transport portions 5 at their points of contact with the material to be treated 10 move in the transport direction 20 in order to transport the material to be treated 10 in the transport direction 20. The rotational direction 143 of the transport portions 15 of the roll 133 provided below the transport plane, is selected so that the transport portions 15 at their points of contact with the material to be treated 10 move in the transport direction 20, in order to transport the material to be treated 10 in the transport direction 20. The retaining surface 4 of the roll 132 provided above the transport plane is rotated in the same direction with the transport portions 5 of the roll 132 in a rotational direction 142, so that the portion of the retaining surface 4 which faces straight towards the material to be treated 10, moves in the direction of the higher liquid level (to the right in FIG. 8). Similarly, the retaining surface 14 of the roll 133 provided below the transport plane is rotated in the same direction with the transport portions 15 in a rotational direction 144, so that the portion of the retaining surface 14 which faces straight towards the material to be treated 10, moves in the direction of the higher liquid level (to the right in FIG. 8).

By a suitable design of the rolls 132, 133, a sufficiently high liquid level 136 may be accumulated whilst the movement of the retaining surfaces 4 towards the region with the high liquid level sufficiently reduces the passage of liquid through the gaps formed on the retaining surfaces 4 of the rolls 132, 133. To this end, the rolls 132, 133 may be designed so that a gap is formed with a minimum gap height of less than 0.3 mm, for example ca. 0.1 mm between the retaining surface 4, 14 and the surface of the material to be treated 10 opposing the retaining surface. For example, the transport portions may be increased by less than 0.3 mm, for example by ca. 0.1 mm, relative to the retaining surface.

In the outflow region, the transport portions 5, 15 of the rolls 134, 135 are rotated in a rotational direction 145, 147 so that the transport portions 5, 15 move at their points of contact with the material to be treated 10 in the transport direction 20.

In order to reduce the passage of liquid through the gaps formed in the outflow region by means of the rolls 134, 135 in the outflow region, the roll 134 provided above the transport plane may be configured so that the retaining surface 4 of the roll 134 may be rotated relative to the transport portion 5 of the roll 134. Similarly, the roll 135 provided below the transport plane may be configured so that the retaining surface 14 of the roll 135 may be rotated relative to the transport portion 15 of the roll 135. In the outflow region, the retaining surface 4 of the roll 134 provided above the transport plane may be rotated in a rotational direction 146 which is the opposing direction to the rotational direction 145 of the transport portion 5 of this roll 134. The retaining surface 14 of the roll 135 provided below the transport plane, may be rotated in a rotational direction 148, which opposes the rotational direction 147 of the transport portion 15 of this roll 135. In this manner, a rotation of the retaining surfaces 4, 14 may also take place in the outflow region so that the portion of the retaining surface 4 of the roll 134 provided above the transport plane, which faces straight towards the material to be treated 10, moves in the direction of the higher liquid level (to the left in FIG. 8). Similarly, the retaining surface 14 of the roll 135 may be rotated in the direction opposing the transport portion 15 so that the portion of the retaining surface 14 of the roll 135, which faces straight towards the material to be treated 10, moves in the direction of the higher liquid level (to the left in FIG. 8).

The roll surface of the roll 134 serving as a retaining surface 4 is rotated so that the points of the roll surface nearest to the transport plane, move in a direction (to the left in FIG. 8) opposing the transport direction of the material to be treated 10. In this manner, a relative movement is produced between the roll surface 4 on the upper edge of the gap 8 and the material to be treated 10. The roll surface of the roll 135 serving as a retaining surface 5 is rotated so that the points of the roll surface nearest to the transport plane move in a direction (to the left in FIG. 8) opposing the transport direction of the material to be treated 10. In this manner, a relative movement is produced between the roll surface on the lower edge of the gap 9 and the material to be treated 10.

Also, the rolls 134, 135 in the outflow region may be designed so that a gap is formed with a minimum gap height of less than 0.3 mm, for example ca. 0.1 mm between the retaining surface 4, 14 and the surface of the material to be treated 10 opposing the retaining surface. For example, the transport portions may be increased by less than 0.3 mm, for example by ca. 0.1 mm, relative to the retaining surface.

Alternatively or additionally, in each case one or more flow devices may be provided in the inflow region and/or in the outflow region of the treatment station 131, in order to remove treatment liquid emerging through the gaps by means of a fluid flow, as explained with reference to FIG. 3.

By a suitable design of the roll pairs, in the inflow region and/or outflow region it is possible to reduce an outflow of liquid through the gaps which remain during transport of the material to be treated, so that in the inflow region and/or in the outflow region of the treatment station a flow device is not provided for blowing away treatment liquid.

In the inflow region and/or in the outflow region, a plurality of devices for removing or holding off treatment liquid may respectively also be provided as explained with reference to FIGS. 4 and 5.

The devices and methods according to different embodiments make it possible in an assembly for the electrolytic or wet-chemical treatment of material to be treated to remove or hold off a treatment liquid from the material to be treated or to increase the exchange of material on the material to be treated, direct contact between fixed elements and a useful region of the material to be treated being able to be reduced or avoided.

Figure 9:
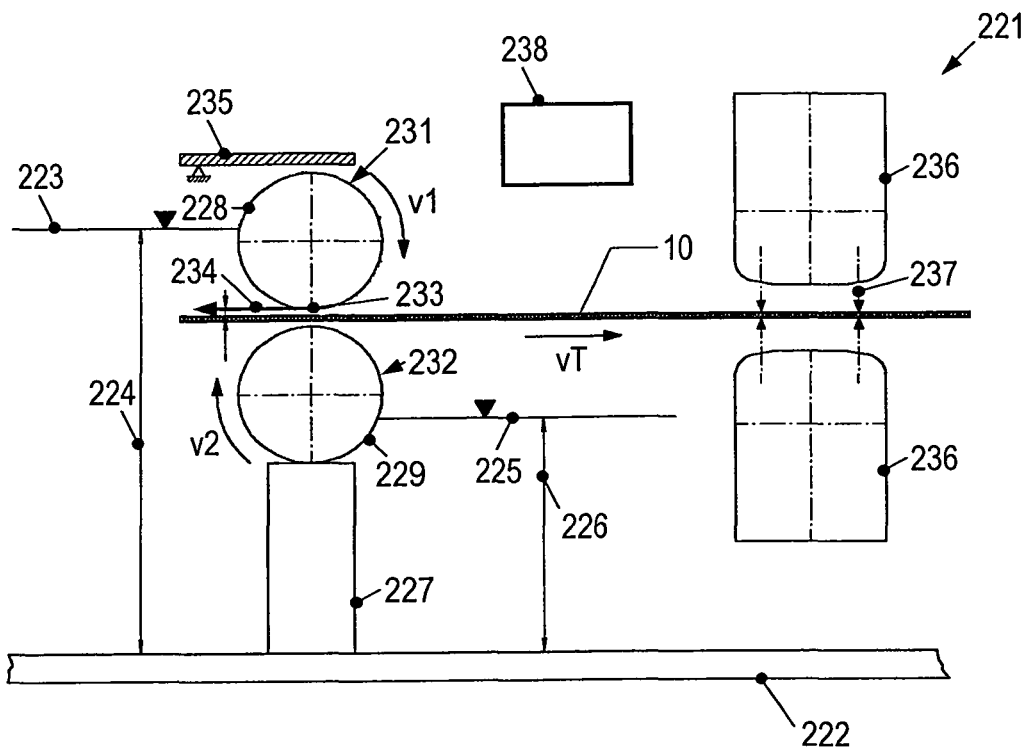
FIG. 9 is a schematic, partially sectional side view of an outflow region of a treatment station according to a further embodiment.

FIG. 9 is a partially sectional side view of an outflow region 221 of a treatment station. The device shown for removing liquid may comprise a pair of rolls 231, 232, a stripping device 235, a flow device 236 and a drive device 238. The device may, for example, be used instead of the nip rolls 214 and/or 215 in the treatment station 200 of FIG. 18.

The treatment station has an inner trough with a base 222. The treatment liquid has in one region of the treatment station an operating level 223 at a height 224 relative to the base 222. The operating level 223 is set so that the material to be treated 10 is covered by the treatment liquid before it passes through the pair of rolls 231, 232. As has already been described with reference to FIGS. 4 and 5, it may be achieved by a barrier 227 in combination with the pair of rolls 231, 232 that the treatment liquid downstream of the barrier 227 only reaches a level 225 below the transport plane of the material to be treated 10. The height 226 of the treatment liquid downstream of the barrier 227 is lower than the height 224 upstream of the barrier.

The rolls 231, 232 are designed so that in any case they are spaced apart from the useful region of the material to be treated 10, which extends continuously between opposing edge portions. The roll 231 is arranged above the transport plane of the material to be treated. The roll 232 is arranged below the transport plane of the material to be treated. Each of the rolls 231, 232 is covered at least on one part of its circumference with treatment liquid. The rolls 231, 232 may be configured so that they are spaced apart from the entire material to be treated 10 when the material to be treated 10 is moved past the rolls 231, 232. In particular, the rolls 231, 232 may be designed so that they do not cooperate during the transport of the material to be treated 10. The rolls 231, 232 may have a cylindrical roll surface 228 and/or 229. A gap between the roll surface 228 of the roll 231 and the material to be treated 10 extends continuously between edge regions of the material to be treated 10 in a width direction. A further gap between the roll surface 229 of the roll 232 and the material to be treated 10 extends continuously between edge regions of the material to be treated 10 in the width direction.

The rolls 231, 232 are driven rotatably by the drive device 238. The drive device may comprise an actuator, for example a motor, and suitable components for transmitting the torque from the actuator to the rolls 231, 232. The drive device 238 for the rolls 231, 232 may comprise components, which at the same time are components of drive devices for other elements, for example transport rolls. Advantageously, the drive device 238 may be provided inside the treatment station. At least the motor of the drive device 238 may be encapsulated.

The drive device 238 drives the roll 231 in such a manner that said roll has a circumferential speed with a value v1. Along the line 233 on which the roll surface 228 of the roll 231 is spaced apart by the gap height from the useful region of the material to be treated 10, the speed vector 234 of the circumferential speed is oriented counter to the transport speed vT of the material to be treated. Due to the viscous resistance between the roll 231 and the treatment liquid, the escape of treatment liquid through the gap may be reduced. Generally, in an inflow region or outflow region of a treatment station, the roll 231 arranged above the transport plane may be driven so that the roll surface on the line defining the gap moves in the direction of the higher level. The value of the speed v1 and/or the rotational speed of the roll 231 may be set depending on a desired difference in levels of the treatment liquid between the two sides of the roll.

The drive device 238 drives the roll 232 such that said roll has a circumferential speed of a value of v2. The roll 231 and the roll 232 are driven so that they rotate in the same direction. In one embodiment, the circumferential speed v2 of the second roll 232 has the same value as the transport speed of the material to be treated vT±20%. As a result, the risk that a material to be treated 10 of low inherent rigidity is deflected so much that it comes into undesirable contact with one of the rolls 231, 232, may be reduced. The roll 232 may also be driven so that the value of the circumferential speed v2 is greater than the value of the transport speed vT.

In one embodiment, the rolls 231, 232 are driven, so that v1=v2.

The drive device 238 may drive the roll 231 so that the roll 231 entrains treatment liquid. The quantity of entrained treatment liquid is dependent on the surface properties of the roll 231, in particular on a surface roughness, on the rotational speed and the diameter of the roll 231.

The stripping device 235 removes entrained treatment liquid from the roll 231. The stripping device 235 may, for example, be configured as a strip which extends parallel to the axis of the roll 231. The stripping device 235 may be configured so that it compensates for a variation of the treatment liquid entrained by the roll 231 in the axial direction of the roll 231. For example, the stripping device 235 in the axial direction of the roll 231 may be at a uniform distance from the roll surface 228. The stripping device 231 may be configured so that it does not completely remove treatment liquid from the roll 231, so that due to the rotation of the roll 231 a film of the treatment liquid is formed with a finite thickness around the roll 231. The stripping device 235 may be configured so that the film of the treatment liquid around the roll 231 reduces the effective cross section of the gap between the roll 231 and the material to be treated 10 for the escape of treatment liquid.

The stripping device 235 may be adjustable relative to the roll 231, in order to set the quantity of treatment liquid held back by the stripping device 235. In this manner, the quantity of treatment liquid held back may be set depending on the case, for example depending on the desired level 223.

The flow device 236 causes a fluid 237, for example air, to flow onto the material to be treated 10. Treatment liquid which, after the passage of the material to be treated 10 between the rolls 231, 232, is still located on the material to be treated 10, may therefore be removed. The flow device may be configured as disclosed with reference to FIGS. 3-5.

Figure 10:
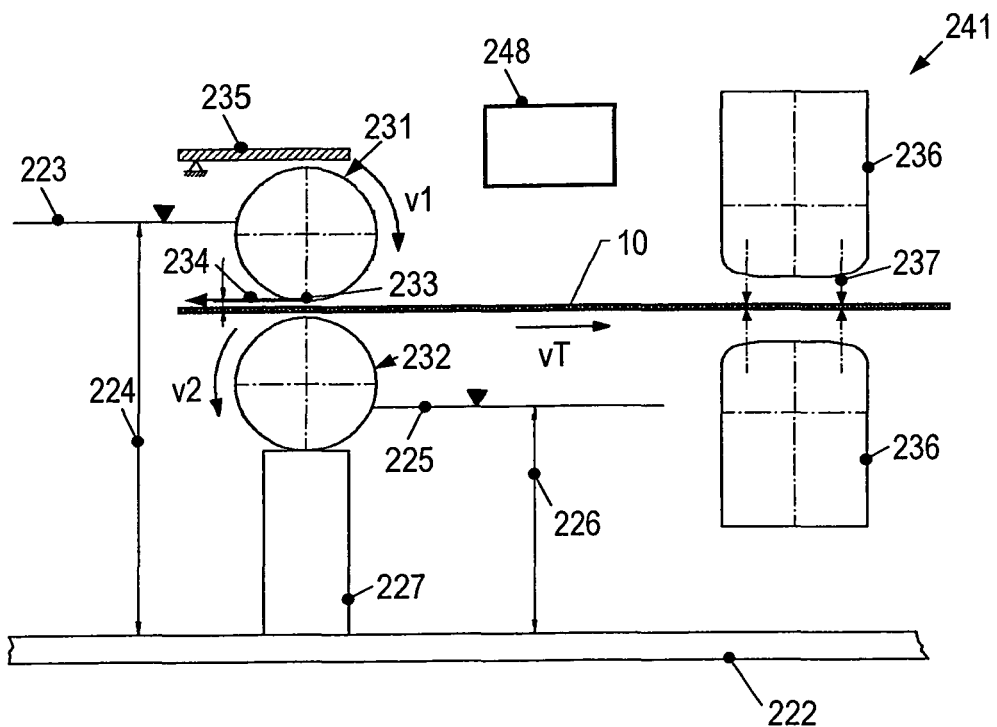
FIG. 10 is a schematic, partially sectional side view of an outflow region of a treatment station according to a further embodiment.

FIG. 10 is a partially sectional side view of an outflow region 241 of a treatment station comprising a device for removing treatment liquid. The device for removing treatment liquid comprises a pair of rolls 231, 232, a stripping device 235, a flow device 236, and a drive device 248. The device may, for example, be used instead of the nip rolls 214 and/or 214 in the treatment station 200 of FIG. 18. Elements and devices which in their design and/or function correspond to elements and/or devices of the outflow region 221 and have been described with reference to FIG. 9, are denoted by the same reference numerals as in FIG. 9.

The drive device 248 is designed so that the roll 232 rotates in the opposite direction to the roll 231. The surface of the roll 232 has a circumferential speed with a value v2. Along the line on which the roll 232 is spaced apart from the material to be treated 10 by the minimum gap height, the circumferential speed is oriented counter to the transport direction of the material to be treated. Due to the viscous resistance between the roll 232 and the treatment liquid, the escape of treatment liquid through the gap between the roll 232 and the material to be treated may be reduced. In particular, for material to be treated 10 with sufficient inherent rigidity, for example for a circuit board with high inherent rigidity, the rolls v1, v2 may be rotated in opposite directions shown in FIG. 10.

The value of the circumferential speed v2 of the roll 232 may, for example, be selected depending on which liquid flow is tolerated through the gap between the roll 232 and the material to be treated 10. By a circumferential speed with a greater value v2, the quantity of treatment liquid escaping per time unit may be reduced. In one embodiment the rolls 231, 232 are driven such that v1=v2.

Whilst with reference to FIGS. 9 and 10, devices comprising a pair of rolls have been described, in further embodiments a plurality of pairs of rolls, as have been described with reference to FIGS. 9 and 10, may be provided in an outflow region of a treatment station. For example, a plurality of such pairs of rolls as described with reference to FIGS. 4 and 5 may be provided spaced apart from one another in the transport direction. In this manner, a series of levels in the manner of a cascade may be achieved. Alternatively or additionally, the pair or rolls comprising a device arranged spaced apart therefrom in the transport direction may be combined with fixed elements, as is shown for example in FIG. 7.

Whilst with reference to FIGS. 9 and 10 devices comprising a pair of rolls have been described, in further embodiments instead of one of the rolls, for example instead of the roll 232 provided below the transport plane, a fixed element may be provided. In further embodiments, both the roll 231 and the roll 232 do not have to be spaced apart from the material to be treated 10. If the side of the material to be treated facing the roll is sensitive to contact, according to embodiments the roll is provided spaced apart from the material to be treated.

Whilst in the context of the embodiments, the use of devices for removing or holding off treatment liquid in an inflow region and/or in an outflow region of an inner region of a treatment station has been described, such a device may also be used spaced apart from the inflow and outflow region of a treatment station, in order to displace liquid, for example for an improved exchange of material, as is described in more detail with reference to FIGS. 11-17. With the different devices described in more detail with reference to FIGS. 11-17, it is possible treat not only planar surfaces of the material to be treated but also advantageously blind holes or through-holes. The devices described with reference to FIGS. 11-17 may be used in a treatment station in combination with or instead of flow nozzles. If the devices are used instead of flow nozzles, by a suitable mechanism treatment liquid is conveyed into the inner region of the treatment station.

Figure 11:
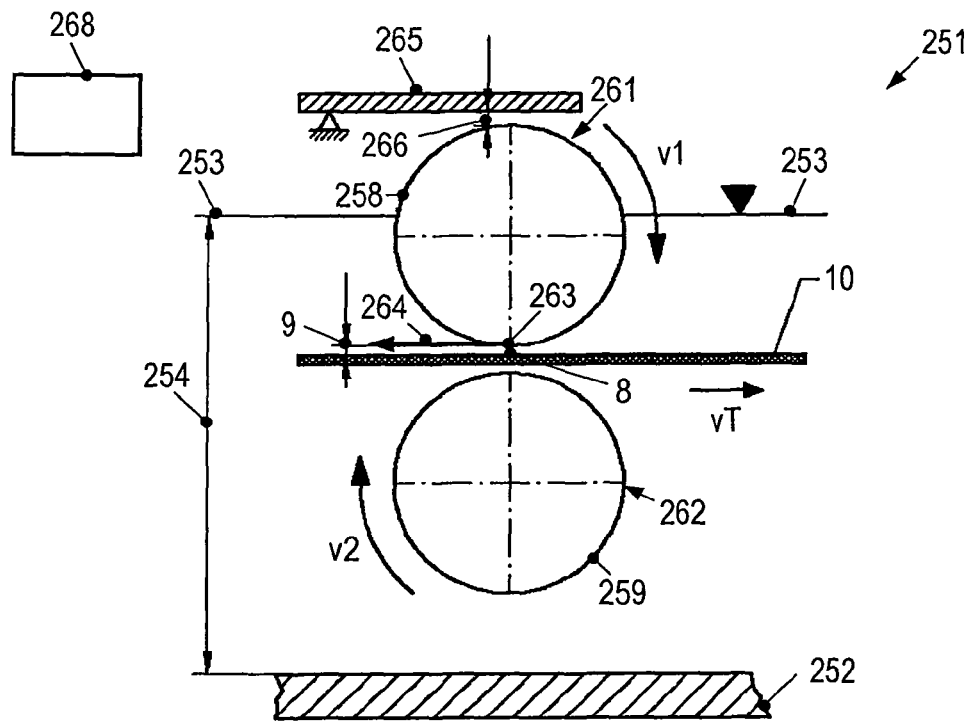
FIGS. 11-17 are respectively schematic, partially sectional side views of a treatment member configured with a roll of a treatment station according to further embodiments.

FIG. 11 is a partially sectional side view of a treatment portion 251 of a treatment station. The portion 251 has a pair of rolls 261, 262, a stripping device 265 and a drive device 268. These elements may be used for promoting the exchange of material on the surface of the material to be treated, for example, instead of the flow nozzles 206, 207 of the treatment station 200 of FIG. 18.

The treatment station has an inner trough with a base 252. The treatment liquid has in a region of the treatment station an operating level 253 with a height 254. The operating level 253 is set so that the material to be treated 10 is covered in the vicinity of the rolls 261, 262 by the treatment liquid.

The rolls 261, 262 are designed so that in any case they are spaced apart from the useful region of the material to be treated 10, which extends between opposing edge portions. The roll 261 is attached above the transport plane of the material to be treated. The roll 262 is attached below the transport plane of the material to be treated. The treatment liquid comes into contact with the opposing sides of the roll 261 in the transport direction, up to the operating level 253. The roll 262 is arranged completely below the level 253.

The rolls 261, 262 may be designed so that they are spaced apart from the entire material to be treated 10, when the material to be treated 10 is moved past the rolls 261, 262. In particular, the rolls 261, 262 may be designed so that they do not cooperate during the transport of the material to be treated 10. The rolls 261, 262 may have a cylindrical surface 258 and/or 259. A gap 8 between the roll 261 and the material to be treated 10 with a gap height 9 extends continuously between edge regions and the material to be treated 10 in a width direction. A further gap between the roll 262 and the material to be treated 10 extends continuously between the edge regions of the material to be treated 10 in the width direction.

The rolls 261, 262 are driven rotatably by the drive device 268. The drive device may comprise an actuator, for example a motor, and suitable components for transmitting the torque from the actuator to the rolls 261, 262. The drive device 268 for the rolls 261, 262 may comprise components which at the same time are components of the drive devices for other elements, for example for transport rolls.

The drive device 268 drives the roll 261 so that the roll surface 258 has a circumferential speed with a value v1. Along the line 263, which represents the limit of the gap formed by the roll surface between the roll 261 and the material to be treated 10, the speed vector 264 of the circumferential speed is oriented counter to the transport speed vT of the material to be treated. The roll surface of the roll 261 and the material to be treated 10 move on the edges of the gap 8 with a relative speed. The exchange of material on the surface of the material to be treated 10 facing the roll 261 may thus be promoted effectively. The drive device 238 drives the roll 262 so that said roll has a circumferential speed with a value of v2.

The roll 261 and the roll 262 are driven by the drive device 268, so that they rotate in the same direction. In particular, the roll 262 arranged below the transport plane may be driven so that the roll surface along the line on which the roll 262 is spaced apart from the material to be treated 10 by the gap height, moves in the direction of the transport speed vT of the material to be treated 10.

A stripping device 265 is provided in order to strip treatment liquid from the roll 261. A spacing 266 between the stripping device 265 and the roll 261 may be adjustable. In this manner the quantity of treatment liquid held back by the stripping device 265 may be set. The design and mode of operation of the stripping device 265 corresponds to the design and mode of operation disclosed for the stripping device 235. In particular, the stripping device may be set so that the roll 261 is completely surrounded by a film of the treatment liquid.

Figure 12:
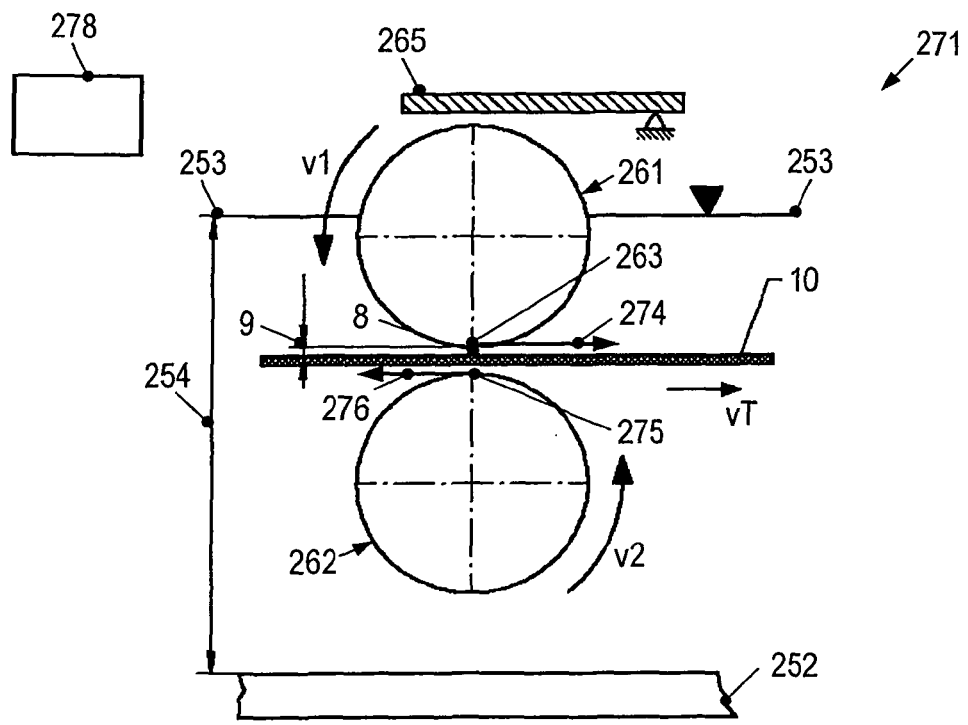

FIG. 12 is a partially sectional side view of a treatment portion 271 of a treatment station. The portion 271 has a pair of rolls 261, 262, a stripping device 265, and a drive device 278. These elements may be used for promoting the exchange of material on the surface of the material to be treated, for example instead of flow nozzles 206, 207 of the treatment station 200 of FIG. 18. Elements and devices which correspond in their design and/or function to elements and/or devices of the portion 251 and have been described with reference to FIG. 11, are denoted by the same reference numerals as in FIG. 11.

The drive device 278 drives the rolls 261, 262 so that they rotate in the same direction. Along the line 263, on which the roll 261 is spaced apart from the useful region of the material to be treated 10 by the gap height 9, the roll surface of the roll 261 moves at a speed 274, which is oriented in the transport direction of the material to be treated 10. The value of circumferential speed v1 may be set so that it is different from the value of the transport speed vT. Along the line 275, on which the roll 262 is spaced apart by the gap height of the gap between the roll 262 and the material to be treated 10 from the useful region of the material to be treated 10, the roll surface of the roll 262 moves at a speed 276 which is oriented counter to the transport direction of the material to be treated 10. This leads to a relative speed between the roll surface of the roll 262 and the material to be treated 10 at the gap.

In further embodiments, the drive device may be designed so that the roll 261 provided above the transport plane and the roll 262 provided below the transport plane are rotated in opposing directions, as will be described with reference to FIGS. 13 and 14.

Figure 13:
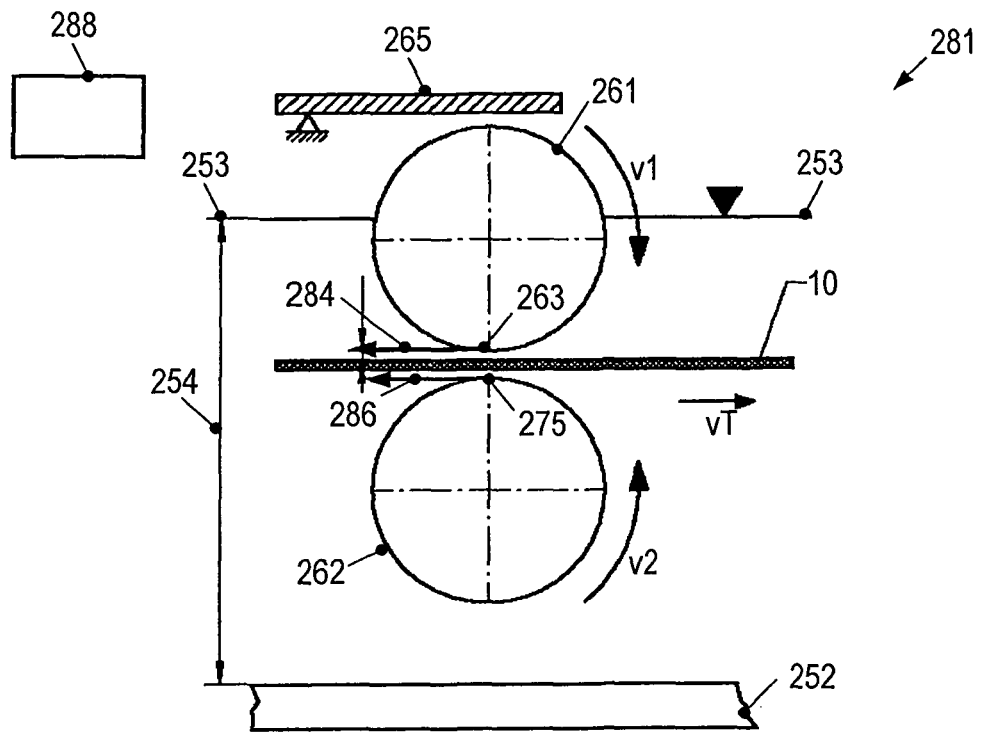

FIG. 13 is a partially sectional side view of a treatment portion 281 of a treatment station. The portion 281 has a pair of rolls 261, 262, a stripping device 265 and a drive device 288. These elements may be used for promoting the exchange of material on the surface of the material to be treated, for example instead of the flow nozzles 206, 207 of the treatment station 200 of FIG. 18 or in combination with the flow nozzles. Elements and devices which correspond in their design and/or function with elements and/or devices of the portion 251 or the portion 271 and have been described with reference to FIG. 11 or FIG. 12, are denoted by the same reference numerals as in FIG. 11 or FIG. 12.

The drive device 288 drives the rolls 261, 263 so that they rotate in opposing directions. Along the line 263 on which the roll 261 is spaced apart from the useful region of the material to be treated 10 by the gap height 9, the roll surface of the roll 261 moves at a speed 284 which is oriented counter to the transport direction of the material to be treated 10. Along the line 275 on which the roll 262 is spaced apart from the useful region of the material to be treated 10 by the gap height of the gap between the roll 262 and the material to be treated, the roll surface of the roll 262 moves at a speed 286 which is oriented counter to the transport direction of the material to be treated 10. As a result, both at the gap which remains between the useful region of the material to be treated 10 and the roll 261, and at the further gap which remains between the useful region of the material to be treated 10 and the roll 262, a relative speed is produced between the material to be treated and the roll 261 and/or 262 defining the gap. The exchange of material may be effectively promoted on both sides of the material to be treated.

Figure 14:
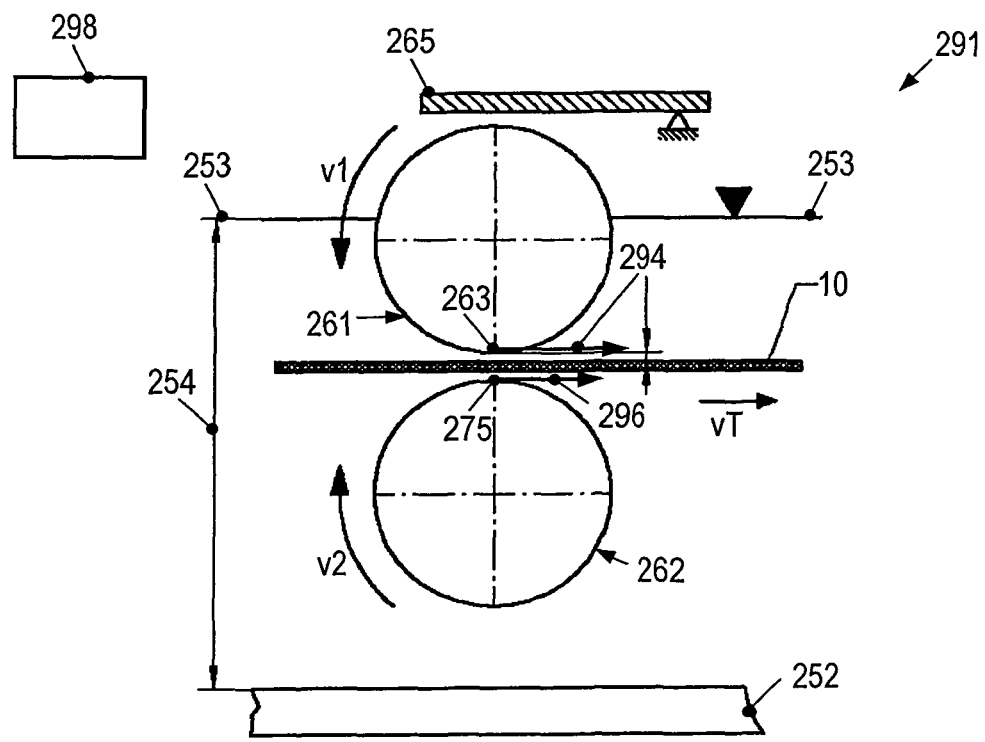

FIG. 14 is a partially sectional side view of a treatment portion 291 of a treatment station. The portion 291 has a pair of rolls 261, 262, a stripping device 265 and a drive device 298. These elements may be used for promoting the exchange of material on the surface of the material to be treated, for example instead of the flow nozzles 206, 207 of the treatment station 200 of FIG. 18 or in combination with the flow nozzles of a treatment station. Elements and devices which in their design and/or function correspond to elements and/or devices of the portion 251 or of the portion 271, and have been described with reference to FIG. 11 or FIG. 12 are denoted by the same reference numerals as in FIG. 11 or FIG. 12.

The drive device 298 drives the rolls 261, 262, so that they rotate in opposite directions. Along the line 263 on which the roll 261 is spaced apart from the useful region of the material to be treated 10 by the gap height 9, the roll surface of the roll 261 moves at a speed 294 which is oriented in the transport direction of the material to be treated 10. Along the line 275 on which the roll 262 is spaced apart from the useful region of the material to be treated 10 by the gap height of the gap between the roll 262 and the material to be treated, the roll surface of the roll 262 moves at a speed 296 which is also oriented in the transport direction of the material to be treated 10.

The value of the speed 294 corresponds to the circumferential speed v1 of the roll 261. The value of the speed 296 corresponds to the circumferential speed v2 of the roll 262. At least one of the circumferential speeds v1 and v2 is different from the value of the transport speed vT of the material to be treated 10. As a result, a relative speed is produced between the corresponding roll and the material to be treated.

In further embodiments, only one roll may be provided as a treatment member. The roll may be provided above the transport plane or below the transport plane. Treatment members in the form of a roll, which have no counter rolls on the other side of the transport plane, may in particular be used for treating through-holes or blind holes.

Figure 15:
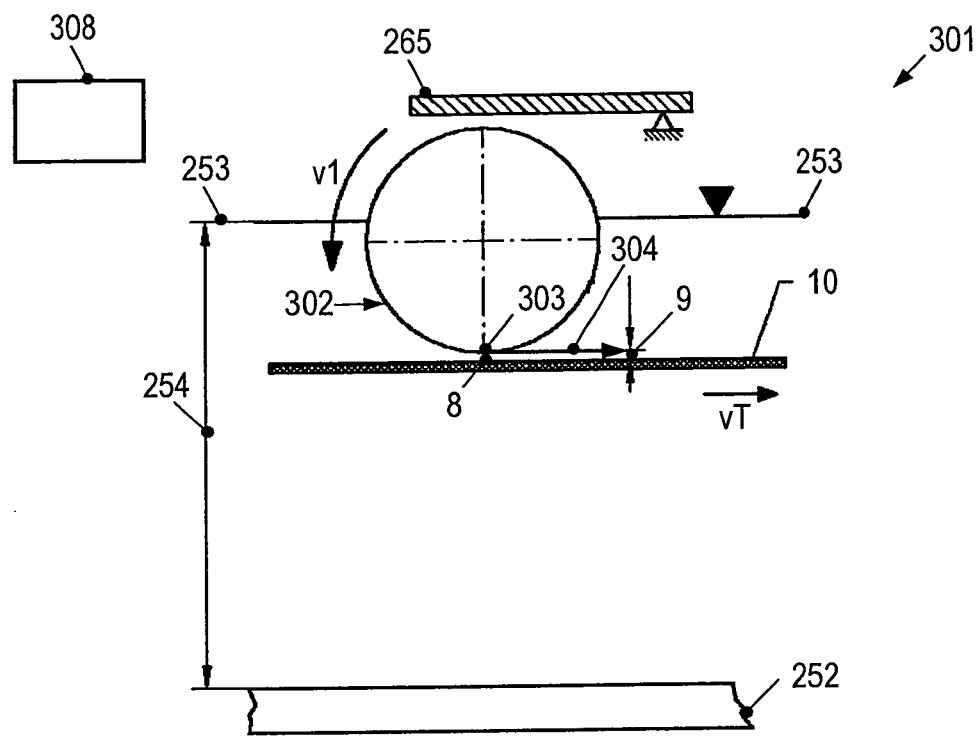

FIG. 15 is a partially sectional side view of a treatment portion 301 of a treatment station. The portion 301 has a roll 302, a stripping device 265 and a drive device 308. These elements may be used for promoting the exchange of material on the surface of the material to be treated, for example instead of the flow nozzles 206, 207 of the treatment station 200 of FIG. 18 or in combination with the flow nozzles of a treatment station. Elements and devices which correspond in their design and/or function with elements and/or devices of the portion 251 or the portion 271 and have been described with reference to FIG. 11 or FIG. 12, are denoted by the same reference numerals as in FIG. 11 or FIG. 12.

The roll 302 is provided above the transport plane and forms a gap extending over the entire useful region of the material to be treated 10 between the surface of the roll 302 and the material to be treated 10. The treatment liquid comes into contact with both sides of the roll 302 up to an operating level 253. The drive device 308 drives the roll 302 rotatably. Along the line 303 on which the roll 302 is spaced apart from the useful region of the material to be treated 10 by the gap height 9, the roll surface of the roll 302 moves at a speed 304 which is oriented in the transport direction of the material to be treated 10. The value of the speed 304 corresponds to the circumferential speed v1 of the roll 302. The value of the circumferential speed v1 is different from the transport speed vT of the material to be treated 10. As a result, a relative speed is produced between the roll 302 and the material to be treated 10 on the edges of the gap 8.

Figure 16:
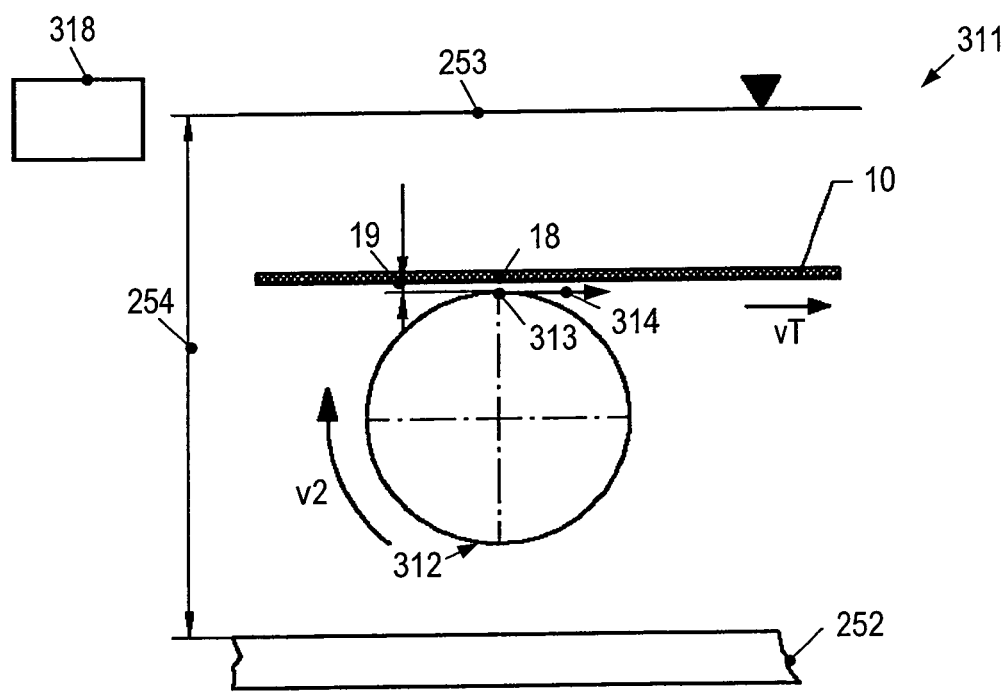

FIG. 16 is a partially sectional side view of a treatment portion 311 of a treatment station. The portion 311 has a roll 312 and a drive device 318. These elements may be used for promoting the exchange of material on the surface of the material to be treated, for example instead of the flow nozzles 206, 207 of the treatment station 200 of FIG. 18 or in combination with the flow nozzles of a treatment station. Elements and devices which in their design and/or function correspond to elements and/or devices of the portion 251 or of the portion 271, and have been described with reference to FIG. 11 or FIG. 12, are denoted by the same reference numerals as in FIG. 11 or FIG. 12.

The roll 312 is provided below the transport plane and forms a gap extending over the entire useful region of the material to be treated 10 between the surface of the roll 312 and the material to be treated 10. The roll 312 is completely surrounded by the treatment liquid. The drive device 318 drives the roll 312 rotatably. Along the line 313 on which the roll 312 is spaced apart from the useful region of the material to be treated 10 by the gap height 19, the roll surface of the roll 312 moves at a speed 314 which is oriented in the transport direction of the material to be treated 10. The value of the speed 314 corresponds to the circumferential speed v2 of the roll 312. The value of the circumferential speed v2 is different from the transport speed vT of the material to be treated 10. As a result, a relative speed between the roll 312 and the material to be treated 10 is produced on the edges of the gap 18.

In further embodiments, the roll 302 of the portion 301 or the roll 312 of the portion 311 may also be driven rotatably so that the roll 302 and/or 312 along the line 303 and/or 313 has a speed vector oriented counter to the transport direction of the material to be treated 10. In particular, such a design may be used with material to be treated of high inherent rigidity.

In further embodiments, a pair of rolls offset relative to one another in the transport direction may be provided as treatment members. Such treatment members may, in particular, be used for treating through-holes.

Figure 17:
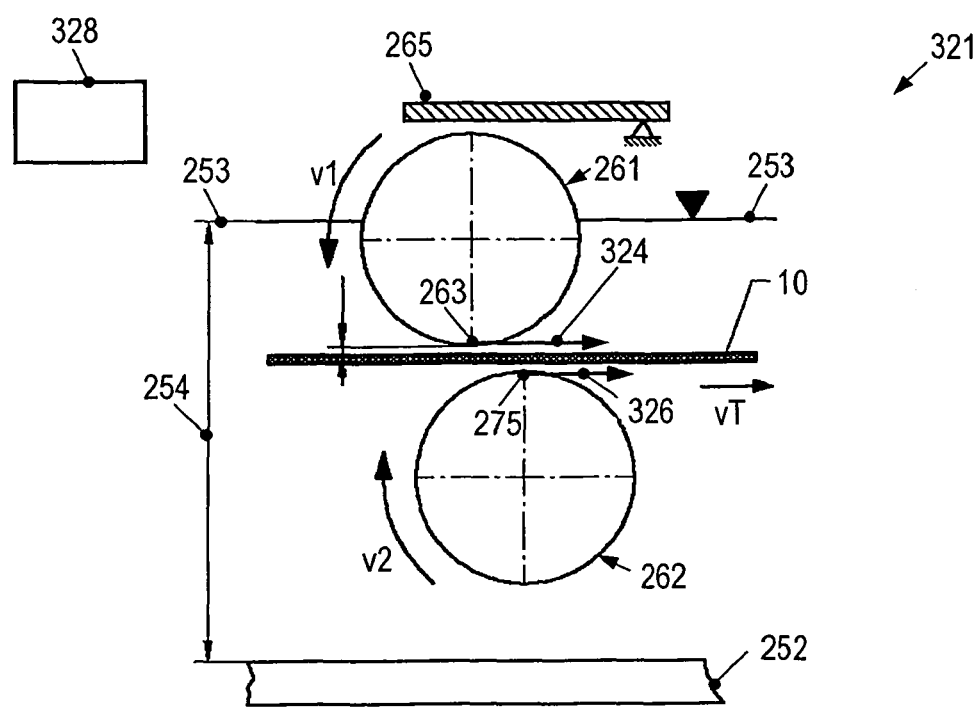

FIG. 17 is a partially sectional side view of a treatment portion 321 of a treatment station. The portion 291 has a pair of rolls 261, 262, a stripping device 265 and a drive device 328. These elements may be used for promoting the exchange of material on the surface of the material to be treated, for example instead of the flow nozzles 206, 207 of the treatment station 200 of FIG. 18 or in combination with the flow nozzles of a treatment station. Elements and devices which in their design and/or function correspond to elements and/or devices of the portion 251 or the portion 271 and have been described with reference to FIG. 11 or FIG. 12, are denoted by the same reference numerals as in FIG. 11 or FIG. 12.

The roll 261 provided above the transport plane and the roll 262 provided below the transport plane, are arranged offset relative to one another in the transport direction. As the arrangement of the rolls is not mirror-symmetrical relative to the transport plane, through-holes may be easily treated.

The drive device 328 drives the rolls 261, 262 so that they rotate in opposing directions. Along the line 263, on which the roll 261 is spaced apart from the useful region of the material to be treated 10 by the gap height 9, the roll surface of the roll 261 moves at a speed 324 which is oriented in the transport direction of the material to be treated 10. Along the line 275 on which the roll 262 is spaced apart from the useful region of the material to be treated 10 by the gap height of the gap between the roll 262 and the material to be treated, the roll surface of the roll 262 moves at a speed 326 which is also oriented in the transport direction of the material to be treated 10.

The value of the speed 324 corresponds to the circumferential speed v1 of the roll 261. The value of the speed 326 corresponds to the circumferential speed v2 of the roll 262. At least one of the circumferential speeds v1 and v2 is different from the transport speed vT of the material to be treated 10. As a result, a relative speed between the corresponding roll and the material to be treated is produced which promotes the exchange of material on the surface of the material to be treated.

In the devices described with reference to the figures, the value of the relative speed between the roll and the material to be treated at the gap is in the range of 0.1 to 20 m/s, in particular in the range of 0.2 to 10 m/s, in particular in the range of 0.5 to 5 m/s.

As has been described with reference to FIGS. 11-14 and 17, a pair of rolls which are provided on opposing sides of the transport plane may be used as a treatment member in a treatment station of a continuous treatment assembly. In the embodiments, the two rolls may be driven rotatably in the same direction. In this case, in particular the roll arranged below the transport plane may be driven so that its circumferential speed along the line which is spaced apart from the useful region of the material to be treated by the gap height, faces in the transport direction. In further embodiments, the two rolls may be driven rotatably in opposing directions. The drive device may be configured so that optionally a rotation of the rolls in the same direction or in opposing directions is produced.

In the different embodiments described with reference to FIGS. 11-14 and 17, the circumferential speed $v1$ of the roll arranged above the transport plane and the circumferential speed $v2$ of the roll arranged below the transport plane are equal. In further embodiments, $v1>v2$, in particular $v1>>v2$, or $v1<v2$, in particular $v1<<v2$. In particular $v2$ may be equal to the value of the transport speed of the material to be treated, $vT\pm 20\%$.

In the various devices described with reference to FIGS. 9-17, the surface of the roll may be cylindrical in each case. The surfaces may be configured as cylindrical surfaces without openings. The surfaces may, in particular, be impermeable to the treatment liquid. The surfaces of the rolls are advantageously cylindrical and extend over the entire useful region of the material to be treated, so that a gap is formed extending continuously between the edge regions. In further embodiments, a plurality of roll-shaped partial elements may be combined, in order to form partially a gap extending over the useful region.

Numerous modifications of the embodiments shown in the figures and described in detail may be implemented in further embodiments.

Whilst with reference to FIGS. 11-17, devices have been described in which a stripping device is provided in the vicinity of a roll, which is provided above the transport plane, in further embodiments a fixed element may also be provided in the vicinity of the roll provided below the transport plane. The fixed element may, for example, be configured as a strip. The strip influences the flow field in the vicinity of the roll. The strip may be adjusted relative to the roll.

In all embodiments described here a roll and/or the rolls may be designed as electrodes for electrolytic treatment. They may be configured, in particular, as inert anodes.

In all embodiments described here a roll and/or the rolls may have a surface which is smooth within treatment tolerances. In further embodiments, the surface of the roll and/or the rolls may also be textured.

In all embodiments described here a roll and/or rolls may also be arranged so that the axis of the roll encloses an angle which is different by 90° from the transport direction.

Whilst in different embodiments, retaining surfaces have been described which extend in the width direction of the material to be treated substantially at the same height transversely to the material to be treated, the gap-forming retaining surface may also be configured so that the cross section of the gap, in particular the gap height, alters in the width direction of the material to be treated. For example, the retaining surface in the width direction of the material to be treated may be concave, so that the gap formed is higher in the middle of the material to be treated than on the edges, depending on the position in the width direction of the material to be treated.

Whilst the different embodiments may be used, in particular, in treatment assemblies in which the material to be treated is transported continuously and in a horizontal transport plane, embodiments may also be used in assemblies in which the material to be treated is transported in a vertical transport plane. For example, a combination of a gap-forming retaining surface and flow device may also be used for accumulating liquid, when the material to be treated is transported in a vertical transport plane. One or more rolls, the axis thereof facing in the vertical direction may be used as a treatment member, when the material to be treated is transported in a vertical transport plane.

Whilst in the context of embodiments, the use of rolls, which are spaced apart from the entire useful region of the material to be treated, have been described in an inflow region or outflow region of a treatment station or as a treatment member, in further embodiments a treatment station may have both at least one rotatably driven roll and a treatment member, as has been described with reference to FIGS. 11-17, and at least one rotatably driven roll in an inflow region or outflow region, as has been described with reference to FIGS. 1-10.

The devices and methods according to the various embodiments may, for example, be used in the production of circuit boards, such as printed circuit boards, without their use being limited thereto.

LIST OF REFERENCE NUMERALS

1 Device for removing treatment liquid
2 Roll
3 Further roll
4 Retaining surface
5, 6 Raised edge portion
7 Shaft
8 Gap
9 Minimum gap height
10 Material to be treated
11 Useful region
12 Edge region
14 Further retaining surface
15, 16 Raised edge portion
17 Shaft
18 Further gap
19 Minimum gap height
20 Transport direction
21 Treatment liquid
22 Liquid level
23 Treatment liquid
24 Liquid level
25, 26 Rotational direction
31 Device for removing treatment liquid
32 Flow device
33 Fluid flow
34 Treatment liquid
41 Outflow region
42 Treatment region
43, 44, 45 Device for removing treatment liquid
46 Base 47, 48 Barrier
51, 52 Roll
53, 55 Roll
54, 56 Flow device
57, 59 Roll
58, 60 Flow device
61 Opening
71, 72 Liquid level
73 Treatment liquid
74 Difference in levels
81 Outflow region
82 Treatment region
83 Device for removing treatment liquid
84-86 Roll
91, 92 Liquid level
93 Treatment liquid
94 Pump
95 Liquid flow
96 Opening
97 Difference in levels
101 Device for removing treatment liquid
102 Roll
103 Further roll
104 Retaining surface
105 Set-back edge portion
106 Further retaining surface
107 Set-back edge portion
108, 109 Retaining rail
111 Device for removing treatment liquid
112, 113 Insert
114, 117 Side surface
115, 118 Gap
116, 119 Chamfer
131 Treatment station
132-135 Roll
136 Liquid level
141-148 Rotational direction
200 Treatment station
201 Inner container
202 Outer container
203 Material to be treated
204 Transport direction
206, 207 Flow nozzle
208 Treatment liquid
209 Level in outer container
210 Pump
211, 212,
214, 216 Transport roll pair
213, 215 Nip roll pair
221 Outflow region
222 Base
223, 225 Liquid level
224, 226 Height
227 Barrier
228, 229 Roll surface
231, 232 Roll
233 Line on roll surface
234 Speed
235 Stripping device
236 Flow device
237 Fluid flow
238 Drive device
241 Outflow region
248 Drive device
251 Treatment portion
252 Base
253 Operating level
254 Height
258, 259 Roll surface
261, 262 Roll
263 Line on roll surface
264 Speed
265 Stripping device
266 Spacing
268 Drive device
271 Treatment portion
274 Speed
275 Line on roll surface
276 Speed
278 Drive device
281 Treatment portion
284, 286 Speed
288 Drive device
291 Treatment portion
294, 296 Speed
298 Drive device
301 Treatment portion
302 Roll
303 Line on roll surface
304 Speed
308 Drive device
311 Treatment portion
312 Roll
313 Line on roll surface
314 Speed
318 Drive device
321 Treatment portion
324, 326 Speed
328 Drive device

The invention claimed is:

1. A method for treating a planar material to be treated, which is transported through an assembly for an electrolytic or wet-chemical treatment of the material to be treated,
the material to be treated being formed with edge regions and a useful region between the edge regions, the useful region configured to receive treatment via a treatment liquid;
the material to be treated being subjected in a treatment station of the assembly to the treatment liquid covering the material to be treated such that the material to be treated is submerged in the treatment liquid, the treatment liquid being accumulated up to an operating level in a treatment region of the treatment station, the material to be treated being transported through the treatment station along a transport direction;
in the treatment station, a roll with a roll surface being arranged such that the roll surface is spaced apart at least from the useful region of the material to be treated so that a gap remains between the roll surface and the useful region of the material to be treated;
the roll being arranged such that a lower part of the roll surface is submerged in the treatment liquid which is accumulated up to the operating level and an upper part of the roll surface projects from the treatment liquid which is accumulated up to the operating level so that the treatment liquid covers the roll surface up to a height which is equal to the operating level; and
the roll being driven rotatably so that at the gap a relative speed is produced between the lower part of the roll surface submerged in the treatment liquid and a surface of the material to be treated.

2. The method according to claim 1, wherein the roll is driven so that a circumferential speed of the roll surface is greater than a transport speed of the material to be treated.

3. The method according to claim 1, wherein the treatment liquid is removed from the roll by a stripping device.

4. The method according to claim 3, wherein the stripping device is displaced relative to the roll to vary a spacing between the stripping device and the roll in order to set a quantity of the treatment liquid which is removed from the roll.

5. The method according to claim 1, wherein the roll is provided as a treatment member in the treatment station.

6. The method according to claim 1, wherein the treatment liquid comes into contact with opposing sides of the roll in the transport direction up to the operating level of the treatment station.

7. The method according to claim 1, further comprising:
in the treatment station, a further roll having a further roll surface being positioned so that a further gap remains between the useful region of the material to be treated and the further roll surface,
wherein the roll and the further roll are positioned on opposing sides of a transport plane of the material to be treated.

8. The method according to claim 1, further comprising:
providing retaining rails for holding each of the edge regions of the material to be treated, the retaining rails defining a recess in which the edge regions of the material to be treated are received, the retaining rails extending linearly along the edge regions,
wherein the roll has axial end portions and a central portion extending between the axial end portions, the axial end portions have a diameter different from a diameter of the central portion, and the axial end portions bear against the retaining rails.

9. The method according to claim 1, wherein the roll is driven to rotate about a rotation axis, wherein a radius of the roll varies along the rotation axis.

10. The method according to claim 1, further comprising:
rotatably driving a further roll in the treatment station, the further roll having a further roll surface which is arranged such that the further roll surface is spaced apart at least from the useful region of the material to be treated so that a further gap remains between the further roll surface and the useful region of the material to be treated,
wherein the gap between the roll surface and the useful region has a gap height, and the further gap between the further roll surface and the useful region has a further gap height which is different from the gap height.

11. A method for producing a circuit board from a material to be treated, in which the material to be treated is transported through an assembly for an electrolytic or wet-chemical treatment of the material to be treated,
the material to be treated being formed with edge regions and a useful region between the edge regions, the useful region configured to receive treatment via a treatment liquid;
the material to be treated being subjected in a treatment station of the assembly to the treatment liquid covering the material to be treated such that the material to be treated is submerged in the treatment liquid, the treatment liquid being accumulated up to an operating level in a treatment region of the treatment station, the material to be treated being transported through the treatment station along a transport direction;
in the treatment station, a roll with a roll surface being arranged such that the roll surface is spaced apart at least from the useful region of the material to be treated so that a gap remains between the roll surface and the useful region of the material to be treated;
the roll being arranged such that a lower part of the roll surface is submerged in the treatment liquid which is accumulated up to the operating level and an upper part of the roll surface projects from the treatment liquid which is accumulated up to the operating level so that the treatment liquid covers the roll surface up to a height which is equal to the operating level; and
the roll being driven rotatably so that at the gap a relative speed is produced between the lower part of the roll surface submerged in the treatment liquid and a surface of the material to be treated.

12. A method for treating a planar material to be treated, which is transported through an assembly for an electrolytic or wet-chemical treatment of the material to be treated,
the material to be treated being formed with edge regions and a useful region between the edge regions, the useful region configured to receive treatment via a treatment liquid;
the material to be treated being subjected in a treatment station of the assembly to the treatment liquid covering the material to be treated such that the material to be treated is submerged in the treatment liquid, the treatment liquid being accumulated up to an operating level in a treatment region of the treatment station, the material to be treated being transported through the treatment station along a transport direction;
in the treatment station, a roll with a roll surface being arranged such that the roll surface is spaced apart at least from the useful region of the material to be treated so that a gap remains between the roll surface and the useful region of the material to be treated;
the roll being arranged such that a lower part of the roll surface is submerged in the treatment liquid which is accumulated up to the operating level and an upper part of the roll surface projects from the treatment liquid which is accumulated up to the opening level so that the treatment liquid covers the roll surface up to a height which is equal to the operating level; and
the roll being driven rotatably so that a circumferential velocity of the roll surface, at a location at which the roll surface is closest to the material to be treated and is submerged in the treatment liquid, has a direction opposite to a direction of transport of the material to be treated.

13. The method according to claim 12, further comprising:
providing retaining rails for holding each of the edge regions of the material to be treated, the retaining rails defining a recess in which the edge regions of the material to be treated are received, the retaining rails extending linearly along the edge regions,
wherein the roll has axial end portions and a central portion extending between the axial end portions, the axial end portions have a diameter different from a diameter of the central portion, and the axial end portions bear against the retaining rails.

14. The method according to claim 12, wherein the roll is driven to rotate about a rotation axis, and a radius of the roll varies along the rotation axis.

15. The method according to claim 12, further comprising:
rotatably driving a further roll in the treatment station, the further roll having a further roll surface which is arranged such that the further roll surface is spaced apart at least from the useful region of the material to be treated so that a further gap remains between the further roll surface and the useful region of the material to be treated,
wherein the gap between the roll surface and the useful region has a gap height, and the further gap between the further roll surface and the useful region has a further gap height which is different from the gap height.

* * * * *